(12) United States Patent
Liaw

(10) Patent No.: US 12,382,676 B2
(45) Date of Patent: Aug. 5, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 557 days.

(21) Appl. No.: 17/576,997

(22) Filed: Jan. 16, 2022

(65) Prior Publication Data

US 2023/0012358 A1    Jan. 12, 2023

Related U.S. Application Data

(60) Provisional application No. 63/220,278, filed on Jul. 9, 2021.

(51) Int. Cl.
| | |
|---|---|
| *H10D 62/10* | (2025.01) |
| *H01L 21/265* | (2006.01) |
| *H10D 30/01* | (2025.01) |
| *H10D 30/67* | (2025.01) |
| *H10D 64/01* | (2025.01) |
| *H10D 64/23* | (2025.01) |

(52) U.S. Cl.
CPC ..... *H10D 62/105* (2025.01); *H01L 21/26533* (2013.01); *H10D 30/031* (2025.01); *H10D 30/6735* (2025.01); *H10D 30/6757* (2025.01); *H10D 62/118* (2025.01); *H10D 64/017* (2025.01); *H10D 64/258* (2025.01)

(58) Field of Classification Search
None
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |

(Continued)

*Primary Examiner* — Nishath Yasmeen
(74) *Attorney, Agent, or Firm* — Cooper Legal Group, LLC

(57) ABSTRACT

A semiconductor device structure includes a first S/D feature over a first device region of a substrate, a plurality of first semiconductor layers over the first device region of the substrate, and each first semiconductor layer is in contact with the first source/drain feature, a first gate electrode layer surrounding a portion of each first semiconductor layer, and a first dielectric spacer contacting the first S/D feature, the first dielectric spacer disposed between and in contact with two first semiconductor layers of the plurality of the first semiconductor layers. The substrate comprises a first dopant region underneath the first S/D feature and a second dopant region underneath first gate electrode layer and radial outwardly of the first dopant region, the first dopant region comprising first dopants having a first conductivity type and a first dopant concentration and the second dopant region comprising the first dopants having a second dopant concentration less than the first dopant concentration.

20 Claims, 25 Drawing Sheets

(56) References Cited

U.S. PATENT DOCUMENTS

| | | | |
|---|---|---|---|
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,947,804 B1* | 4/2018 | Frougier | H10D 30/6743 |
| 2011/0278670 A1* | 11/2011 | Loh | H10D 12/211 |
| | | | 257/E29.267 |
| 2020/0044023 A1* | 2/2020 | Reznicek | H10D 62/151 |
| 2021/0066506 A1* | 3/2021 | Liaw | H10D 62/105 |

* cited by examiner

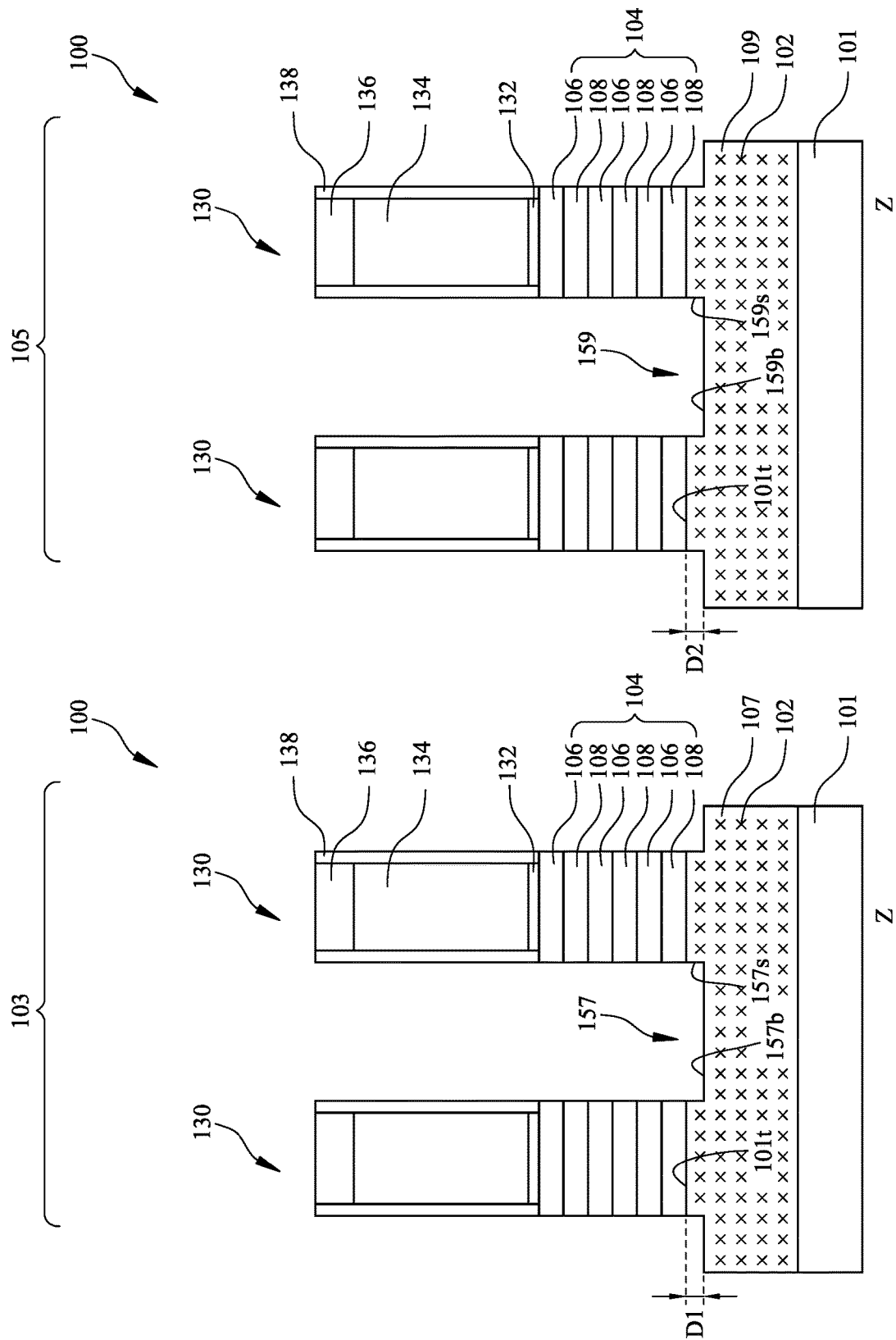

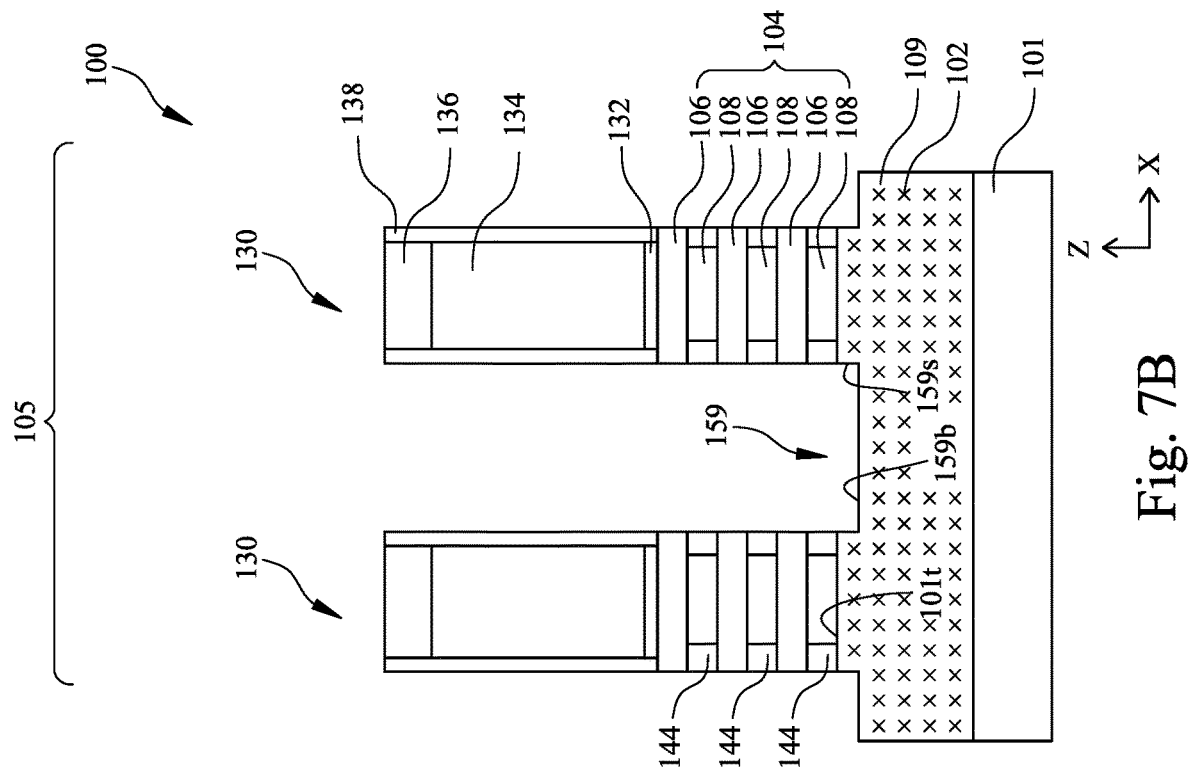
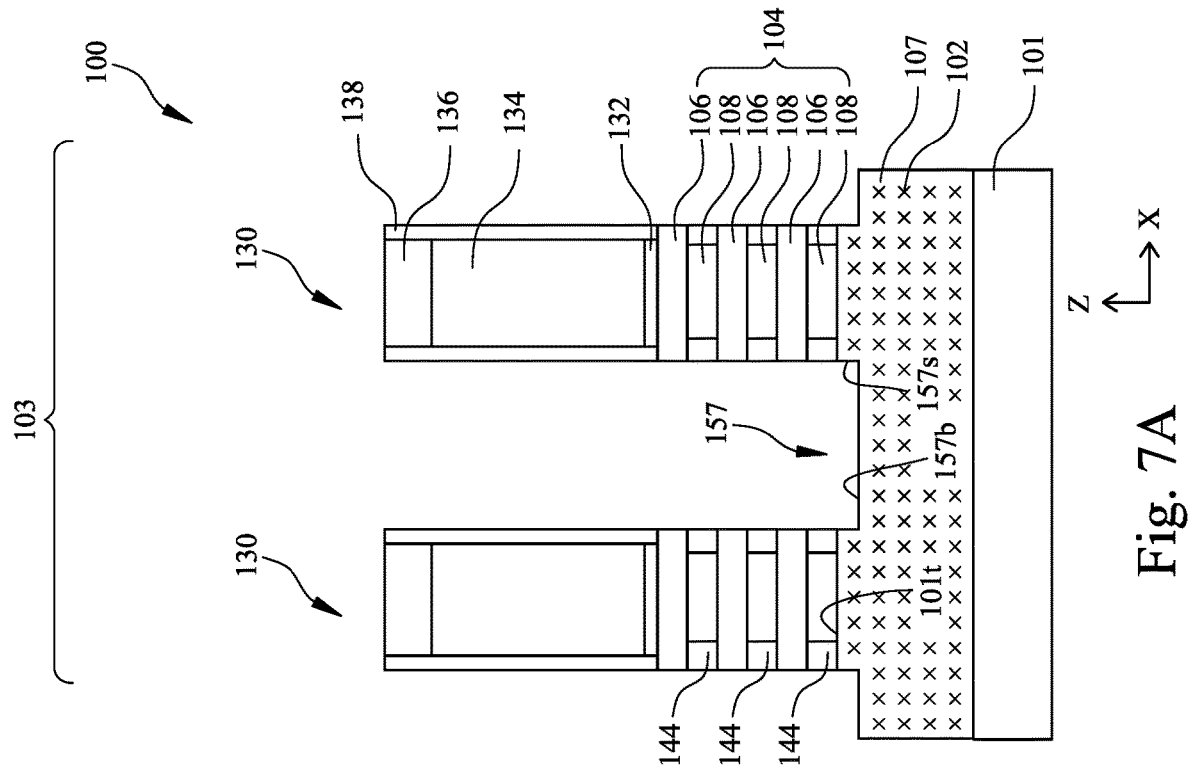

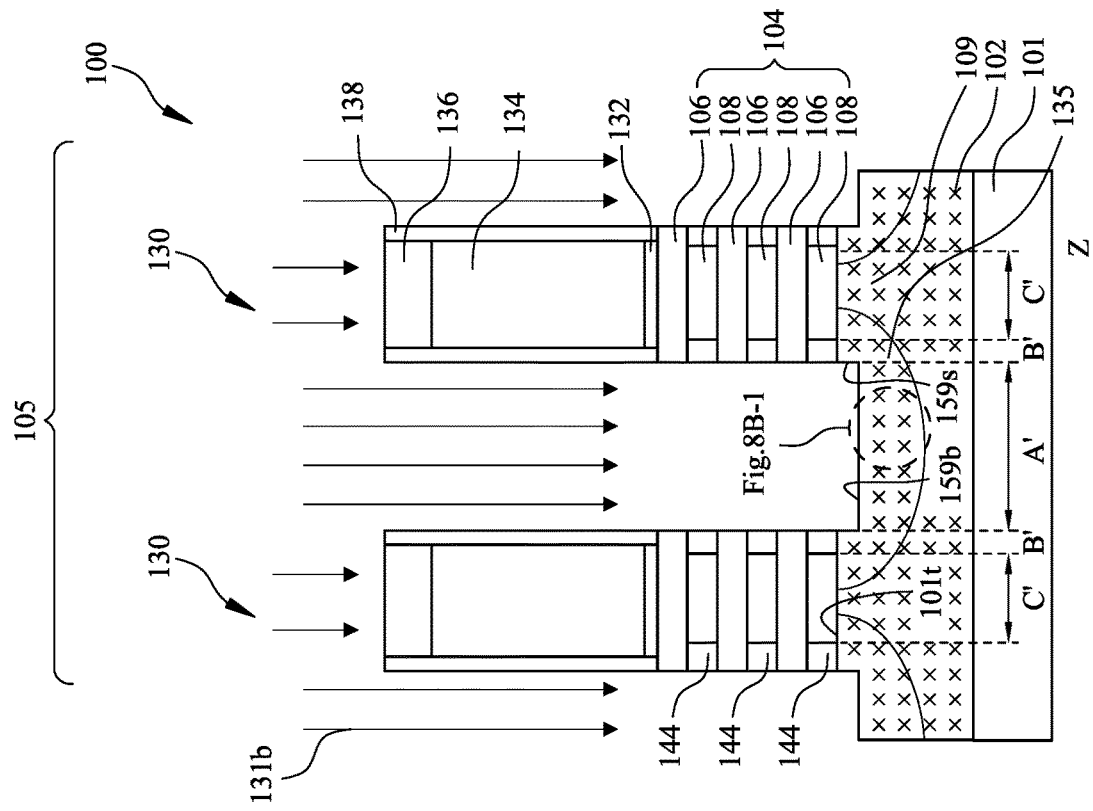
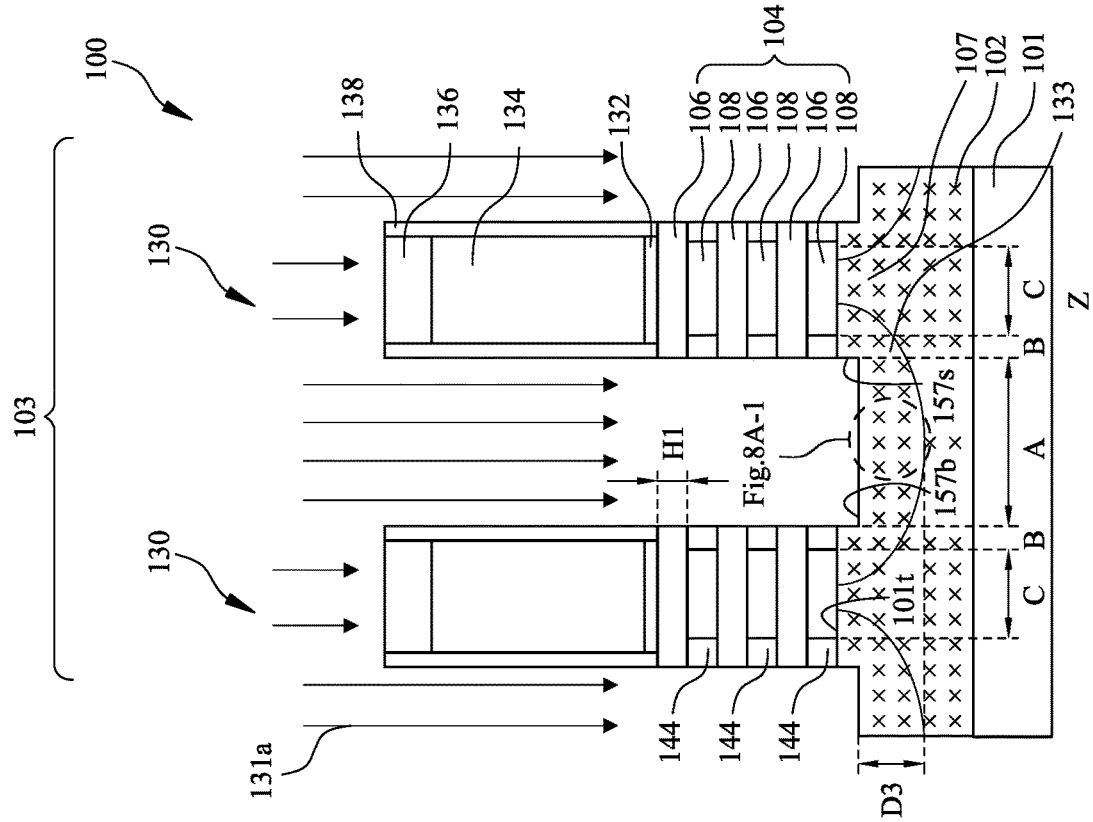

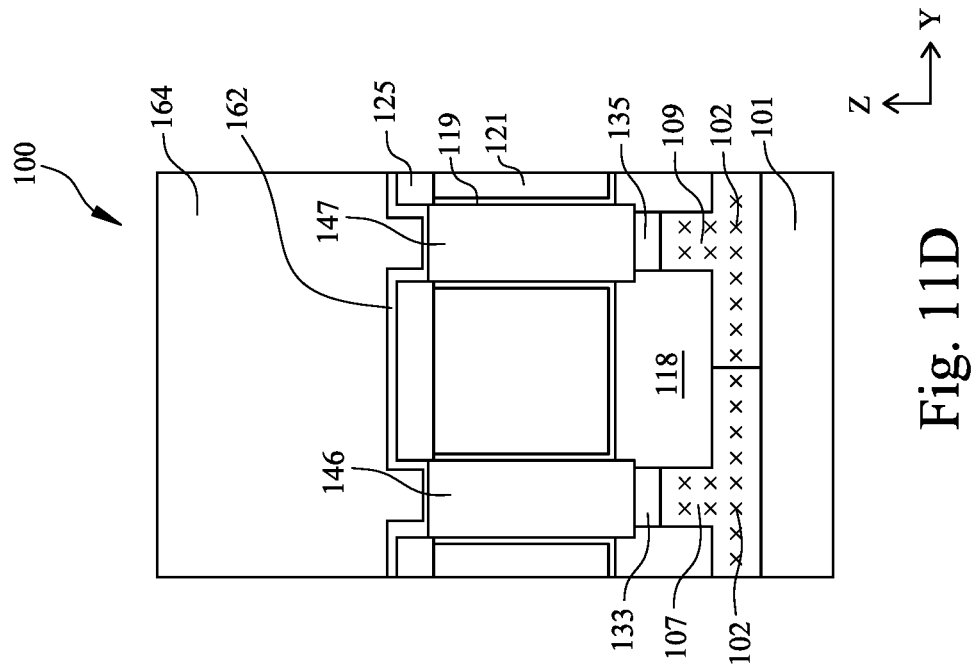
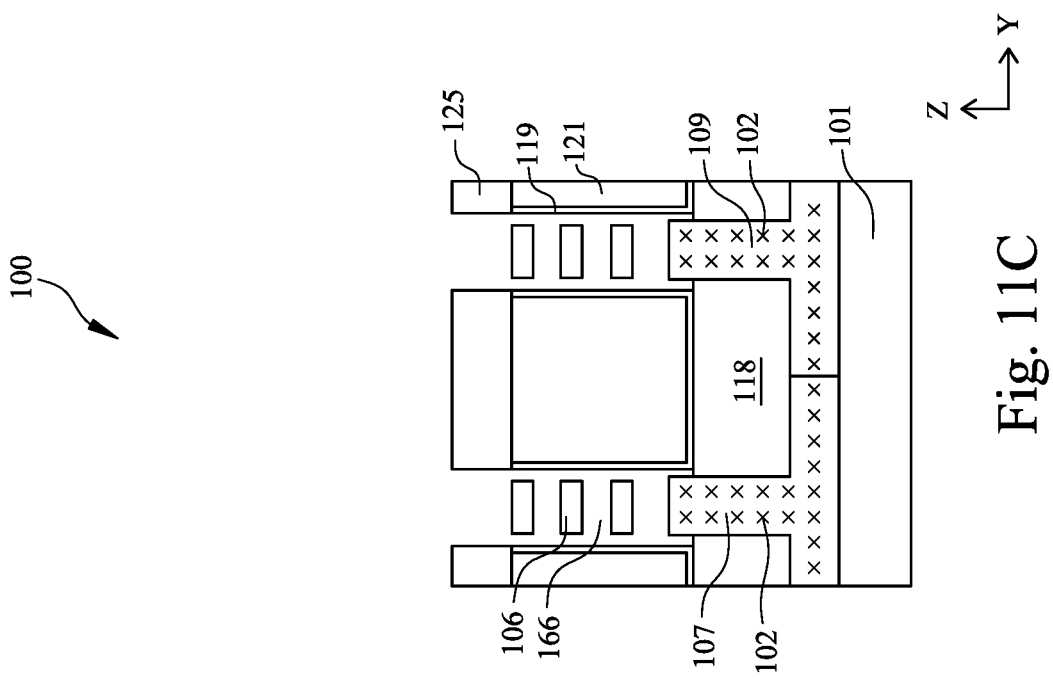
Fig. 11D
Fig. 11C

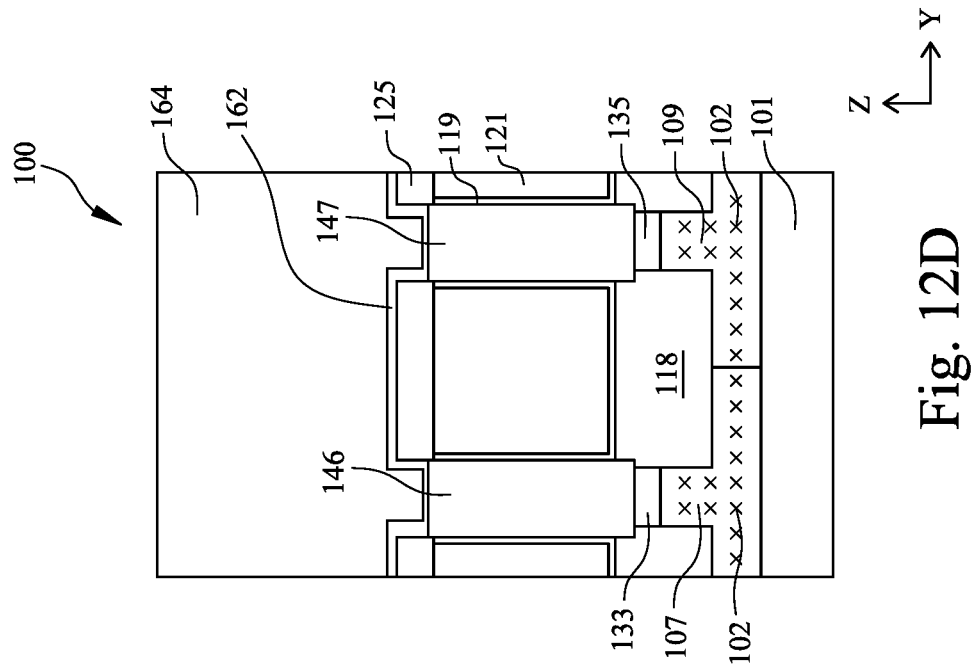
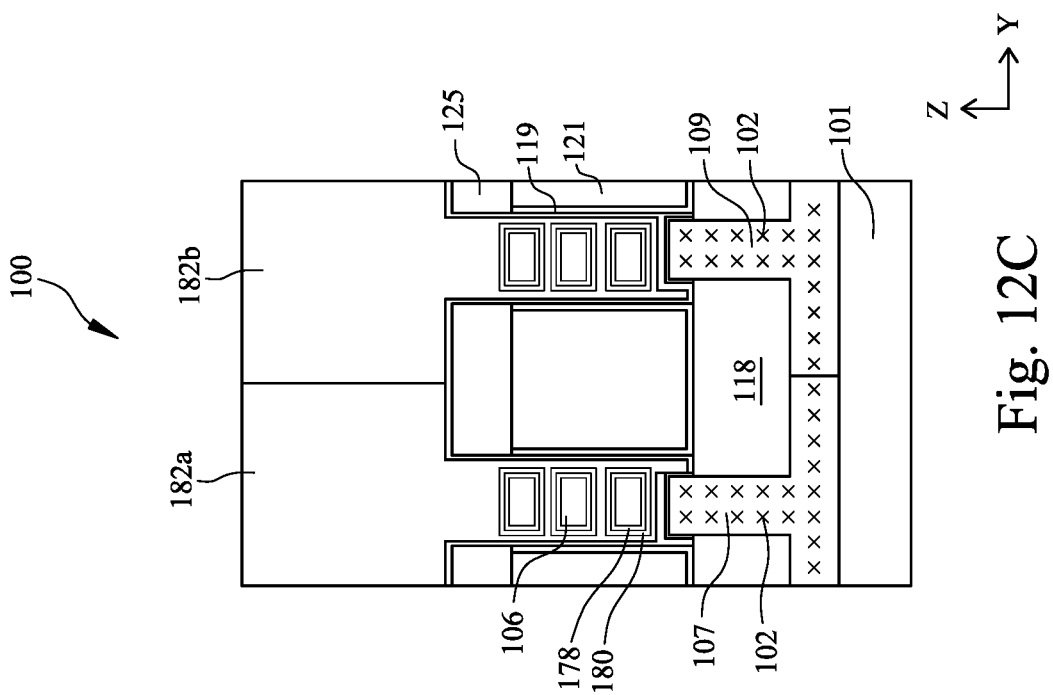

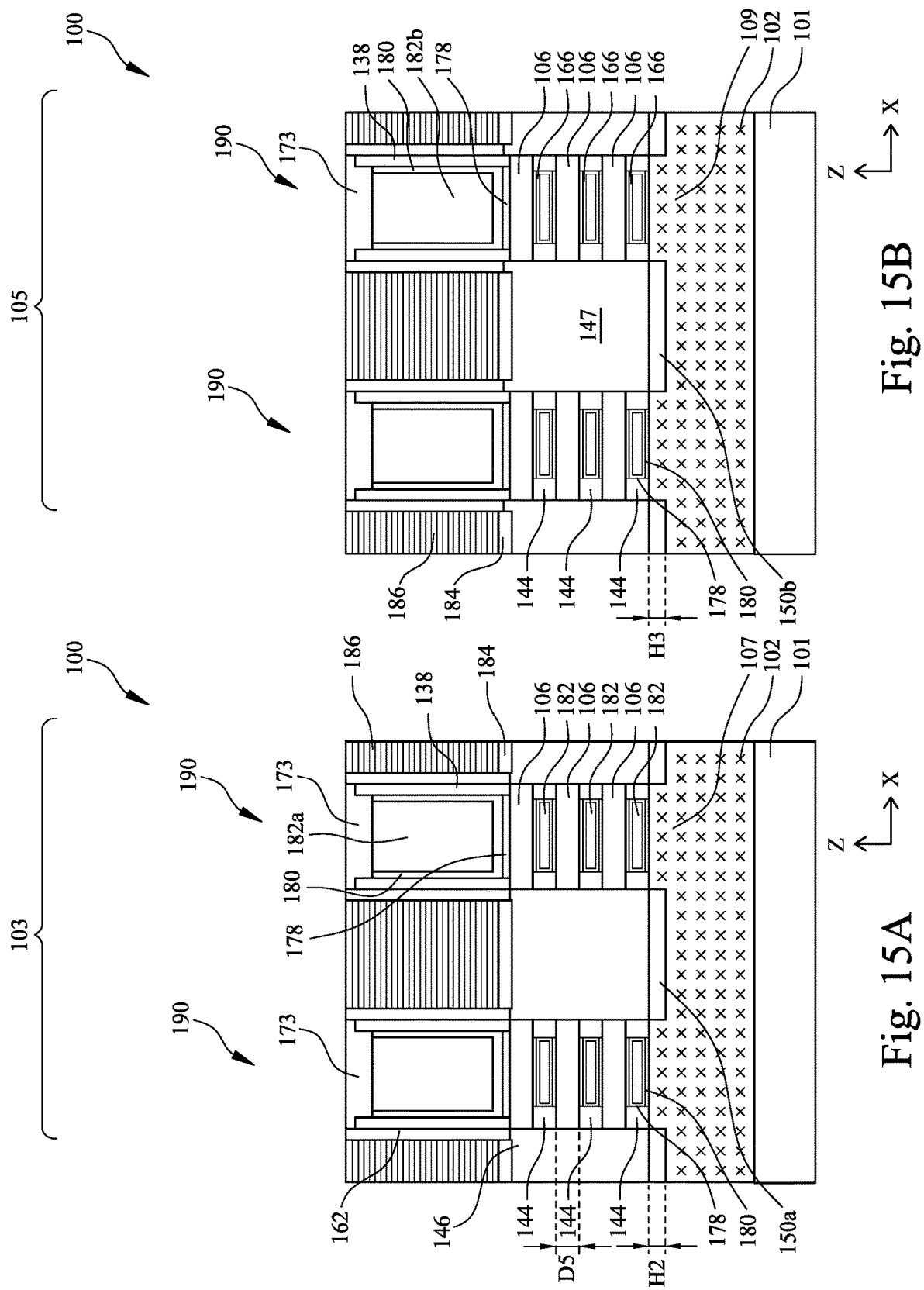

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, as transistor, such as a multi-gate field effect transistor (FET), is continually scaled down in dimension, numerous challenges have risen. For example, the off-state current leakage and voltage threshold (Vt) shift issues that are induced by anti-punch through (APT) doping diffusion during fabrication have become a significant concern. Therefore, further improvements are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-15A are cross-sectional side views of various stages of manufacturing the semiconductor device structure taken along cross-section A-A of FIG. 5, in accordance with some embodiments.

FIGS. 6B-15B are cross-sectional side views of various stages of manufacturing the semiconductor device structure taken along cross-section B-B of FIG. 5, in accordance with some embodiments.

FIGS. 6C-15C are cross-sectional side views of various stages of manufacturing the semiconductor device structure taken along cross-section C-C of FIG. 5, in accordance with some embodiments.

FIGS. 6D-15D are cross-sectional side views of various stages of manufacturing the semiconductor device structure taken along cross-section D-D of FIG. 5, in accordance with some embodiments.

FIG. 8A-1 is an enlarged view of a portion of the implant region showing an exemplary dopant distribution profile according to embodiments of the present disclosure.

FIG. 8B-1 is an enlarged view of a portion of the implant region showing an exemplary dopant distribution profile according to embodiments of the present disclosure.

FIG. 14 illustrates a top down view of NMOS gate all around transistors formed together with PMOS gate all around transistors, in accordance with some embodiments.

DETAILED DESCRIPTION

Figure 1:
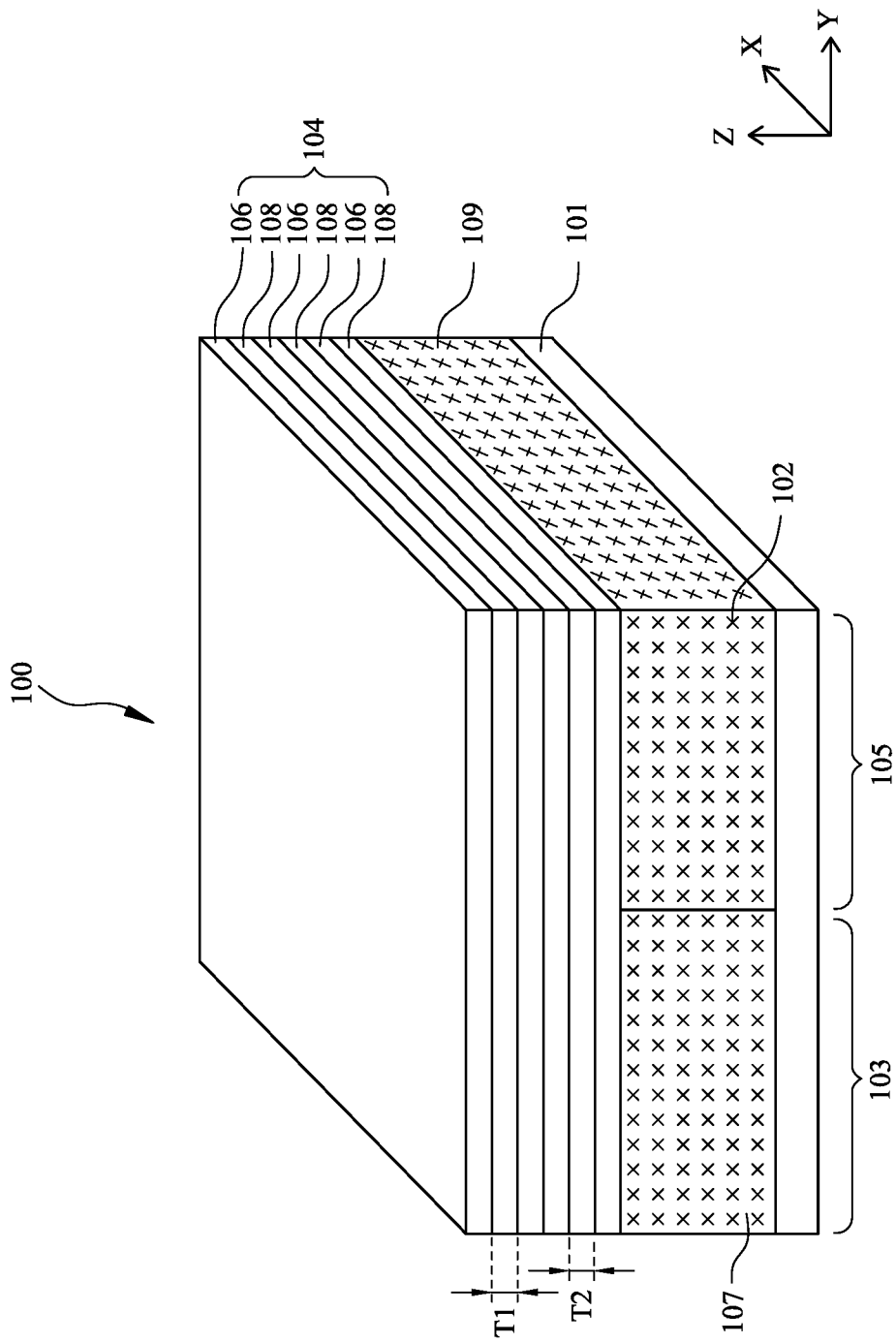
FIGS. 1-5 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of this disclosure are described with respect to the integration of horizontal gate-all-around nanosheet transistors for use in the design and operation of integrated circuits in the 5 nm technology node and below. Such embodiments help to mitigate bottom sheet voltage threshold (Vt) shift issues that are induced by anti-punch through (APT) doping diffusion during fabrication of gate all-around (GAA) transistors. It should be noted that implementations of some aspects of the present disclosure may be used in other processes and/or in other devices, such as planar FETs, FinFETs, Vertical Gate All Around (VGAA) FETs, and other suitable devices. A person having ordinary skill in the art will readily understand other modifications that may be made are contemplated within the scope of this disclosure.

In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-15D show exemplary processes for manufacturing a semiconductor device structure 100 according to embodiments of the present disclosure. It is understood that additional operations can be provided before, during, and after processes shown by FIGS. 1-15D, and some of the operations described below can be replaced or eliminated, for additional embodiments of the method. The order of the operations/processes is not limiting and may be interchangeable.

FIGS. 1-5 are perspective views of various stages of manufacturing a semiconductor device structure 100 in accordance with some embodiments. With reference to FIG. 1, the semiconductor device structure 100 is illustrated to include a substrate 101 into which dopants have been implanted in order to form wells. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), indium phosphide (InP), or a combination thereof. In one embodiment, the substrate 101 is made of silicon. The substrate 101 may be doped or un-doped. The substrate 101 may be a bulk semiconductor substrate, such as a bulk silicon substrate that is a wafer, a silicon-on-insulator (SOI) substrate, a multi-layered or gradient substrate, or the like.

The substrate 101 includes a first device region 103 for forming n-type devices, such as NMOS devices (e.g., n-type gate all around transistors) and a second device region 105 for forming p-type devices, such as PMOS devices (e.g., p-type gate all around transistors). To separate the first device region 103 and the second device region 105, wells may be formed within the substrate 101 with n-type dopants and p-type dopants. To form the desired wells, the n-type dopants and the p-type dopants are implanted into the substrate 101 depending upon the devices that are to be formed. For example, n-type dopants such as phosphorous or arsenic may be implanted to form n-type wells, while p-type dopants such as boron may be implanted to form p-type wells. The n-type wells and p-type wells may be formed using one or more implantation techniques, such as diffusion implantations, ion implantations (e.g., plasma doping, beam line implant doping), selective implantations, deep-well implantations, and the like, or combinations thereof. Masking techniques may also be utilized to mask some regions (e.g., second device region 105) of the substrate 101 while exposing other regions (e.g., first device region 103) of the substrate 101 during a first well implantation (e.g., n-type wells) process. Once the first well implantation process has been completed, the mask is removed to expose the previously masked regions (e.g., second device region 105) and another mask may be placed over the previously exposed regions (e.g., first device region 103) during a second well implantation (e.g., p-type wells) process. In one embodiment shown in FIG. 1, the substrate 101 includes an n-type well 107 and a p-type well 109. While the first device region 103 is shown adjacent to the second device region 105, it is understood that the first device region 103 may be disposed away from the second device region 105 at different regions of the substrate 101 along the X direction or Y direction, 105, and the first and second device regions 103, 105 belong to a continuous substrate (e.g., substrate 101).

In some embodiments, one or more anti-punch through (APT) implantations are performed to implant anti-punch through dopants (represented in FIG. 1 by the Xs labeled 102) into the substrate 101. The anti-punch through dopants 102 help to reduce or prevent the short channel effect of electrons or holes punching through from the source to the drain. The anti-punch through dopants 102 in the first device region 103 may be doped the same as the well in the first device region 103 but with a higher dopant concentration, and the anti-punch through dopants 102 in the second device region 105 may be doped (in a separate process) the same as the well in the second device region 105 but with a higher dopant concentration. Furthermore, the APT implantation process may include a series of implant steps (e.g., Well 107, Well 109, and APT). In some embodiments, each implant step uses an implantation dosage into the substrate 101 with a concentration in a range of about $1E10^{13}$ atoms/cm$^2$ to about $1.5E10^{14}$ atoms/cm$^2$. However, any suitable implantation and dosage may be utilized.

In one exemplary embodiment in which the first device region 103 is utilized to form an n-type gate all around transistor, the APT implantation process and the well 107 implantation process may include: (1) implanting a p-type APT dopant (e.g., boron) into the first device region 103 at a first implant dosage of between about $3E10^{13}$ atoms/cm$^2$ and about $5E10^{14}$ atoms/cm$^2$, wherein the p-type dopant may be implanted at a first kinetic energy in a range of about 3 KeV to about 10 KeV; (2) implanting a p-type dopant (e.g., boron) into the first device region 103 at a second implant dosage of between about $5E10^{13}$ atoms/cm$^2$ and about $4E10^{14}$ atoms/cm$^2$, wherein the p-type dopant may be implanted at a second kinetic energy in a range of about 10 KeV to about 80 KeV. However, any suitable dopant dosages and any suitable kinetic energy may be utilized. For example, the first implant dosage and/or first kinetic energy may be greater or less than the second implant dosage and/or second kinetic energy.

In one exemplary embodiment in which the second device region 105 is utilized to form an p-type gate all around transistor, the APT implantation process and the well 109 implantation process may include: (1) implanting an n-type APT dopant (e.g., phosphorus) into the second device region 105 at a first implant dosage of between about $3E10^{13}$ atoms/cm$^2$ and about $5E10^{14}$ atoms/cm$^2$, wherein the n-type dopant may be implanted at a first kinetic energy in a range of about 5 KeV to about 15 KeV; (2) implanting an n-type dopant (e.g., phosphorous) into the second device region 105 at a second implant dosage of between about $2E10^{13}$ atoms/cm$^2$ and about $1E10^{14}$ atoms/cm$^2$, wherein the n-type dopant may be implanted at a second kinetic energy in a range of about 20 KeV to about 200 KeV. However, any suitable dopant dosages and any suitable kinetic energy may be utilized. For example, the first implant dosage and/or first kinetic energy may be greater or less than the second implant dosage and/or second kinetic energy.

FIG. 1 also illustrates a stack of semiconductor layers 104 is formed over the substrate 101 at the first and second device regions 103, 105. The stack of semiconductor layers 104 includes semiconductor layers made of different materials to facilitate formation of nanosheet channels in a multi-gate device, such as nanosheet FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108, and the first and second semiconductor layers 106, 108 are disposed parallelly with each other. The first semiconductor layers 106 and the second semiconductor layers 108 are made of semiconductor materials having different etch selectivity and/or oxidation rates. For example, the first semiconductor layers 106 may be made of Si doped with Ge and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range that is lower or greater than the first Ge concentration range. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layers 106 and the second semiconductor layers 108 may vary depending on the application and/or device performance considerations. In some embodiments, each first and second semiconductor layer 106, 108 has a thickness T1, T2 of about 2 nm to about 30 nm, respectively. In other embodiments, each first and second semiconductor layer 106, 108 has a thickness T1, T2 of about 10 nm to about 20 nm. The thickness T1 of the first semiconductor layer 106 may be equal to, less than, or greater than the thickness of the thickness T2 of the second semiconductor layer 108. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a vapor-phase epitaxy (VPE), a molecular beam epitaxy (MBE) process, a metalorganic chemical vapor deposition (MOCVD) process, and/or other suitable growth processes, such as chemical vapor deposition (CVD), low pressure CVD (LPCVD), atomic layer CVD (ALCVD), ultra-high vacuum CVD (UHVCVD), reduced pressure CVD (RPCVD), a combination thereof, or the like. While three first semiconductor layers 106 and three second semiconductor layers 108 are alternately arranged as illustrated in FIG. 1, any number of first and second semiconductor layers 106, 108 can be formed in the stack of semiconductor layers 104, depending on the predetermined number of nanosheet channels for each FET. For example, the number of first semiconductor layers 106, which is the number of channels, may be between 2 and 8.

Figure 2:
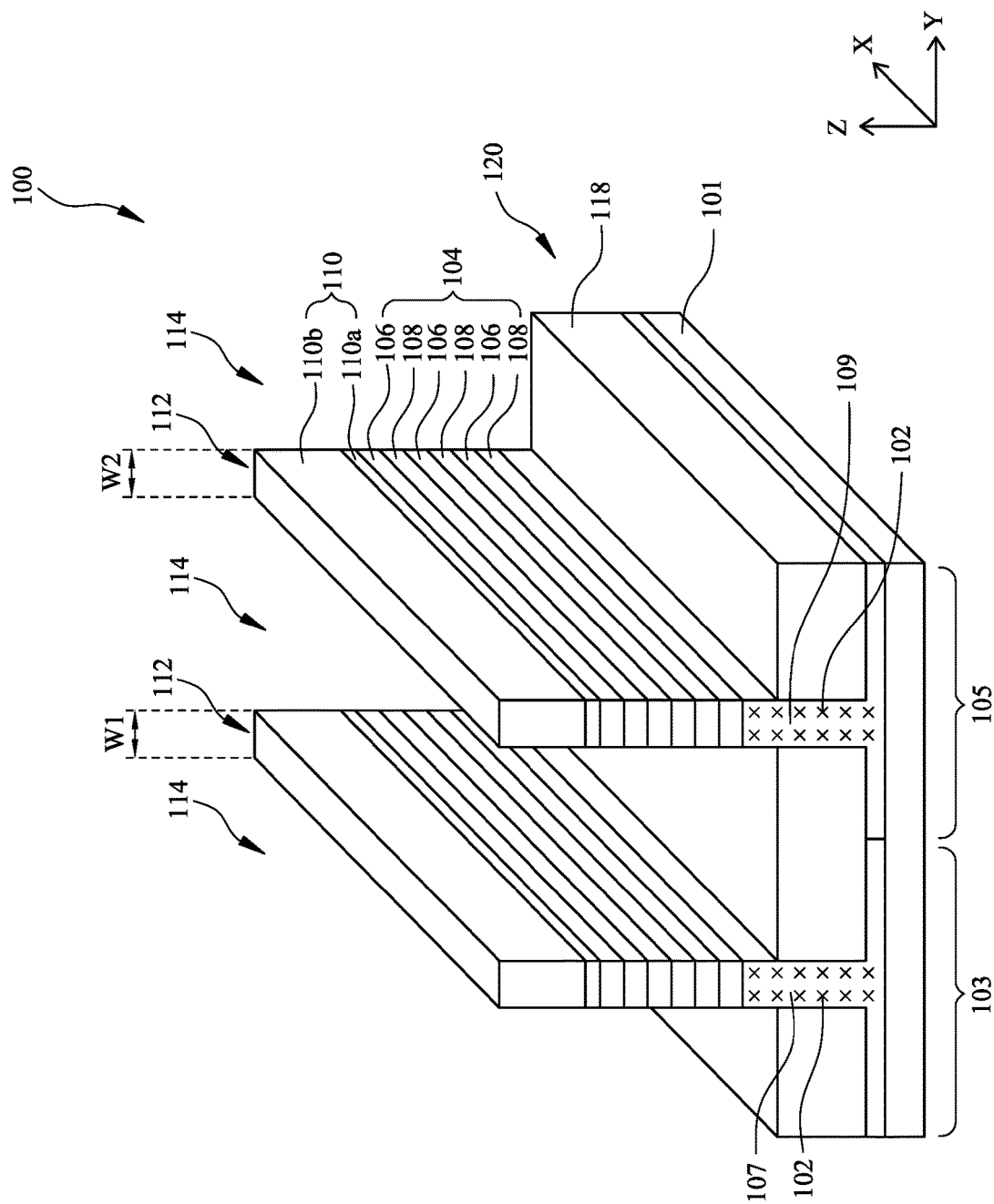

In FIG. 2, fin structures 112 are formed from the stack of semiconductor layers 104, and an insulating material 118 is formed in the trenches 114 between the fin structures 112. Each fin structure 112 has a portion including the semiconductor layers 106, 108, a portion of the wells 107, 109, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer. The hard mask 110b may be a nitrogen-containing layer. The fin structures 112 may be fabricated using suitable processes including photolithography and etch processes. In some embodiments, the photolithography process may include forming a photoresist layer (not shown) over the mask structure 110, exposing the photoresist layer to a pattern, performing post-exposure bake processes, and developing the photoresist layer to form a patterned photoresist layer. The patterned photoresist layer may then be used to protect regions of the substrate 101 and layers formed thereupon, while an etch process forms trenches 114 in unprotected regions through the mask structure 110, the stack of semiconductor layers 104, and into the wells 107, 109 of the substrate 101, thereby forming the extending fin structures 112. A width W1 of the fin structures 112 at the first device region 103 along the Y direction may be in a range between about 3 nm and about 44 nm. A width W2 of the fin structures 112 at the second device region 105 along the Y direction may be equal to, less than, or greater than the width W1. In some embodiments, the width W2 is less than the width W1, and the ratio of width W2 to width W1 may be in a range of about 1:1.2 to about 1:2, for example about 1:1.3. The trenches 114 may be etched using a dry etch (e.g., RIE), a wet etch, and/or combination thereof. While two fin structures 112 are shown, the number of the fin structures is not limited to two.

After the fin structures 112 are formed, the insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) process and/or an etch-back process, is performed to expose the top of the fin structures 112. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as LPCVD, plasma enhanced CVD (PECVD) or flowable CVD (FCVD). Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. A top surface of the insulating material 118 may be level with or below a surface of the second semiconductor layer 108 in contact with the wells 107, 109.

Figure 3:
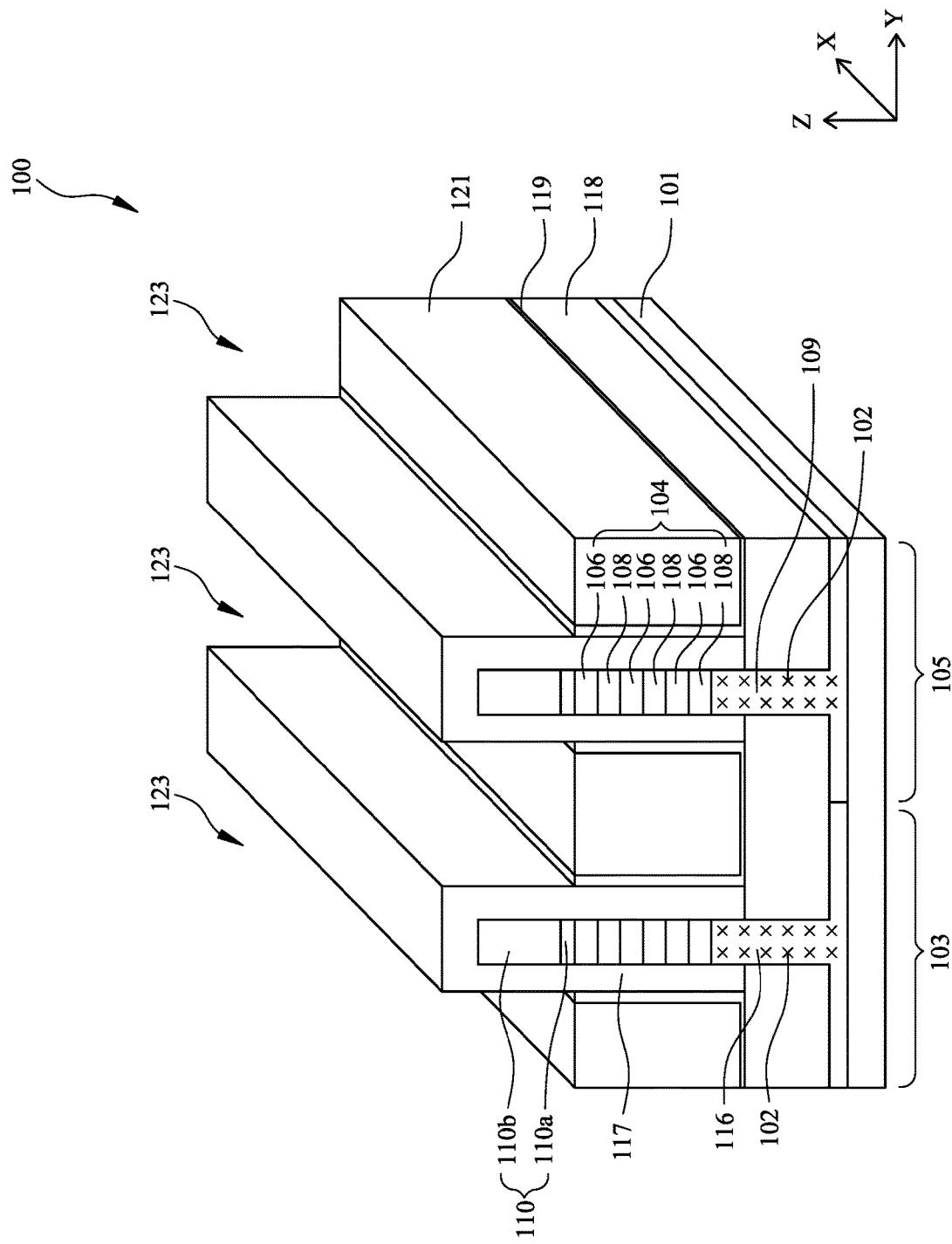

In FIG. 3, a cladding layer 117 is formed over exposed portion of the fin structures 112. The cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 are to be removed subsequently to create space for the subsequently formed gate electrode layer. A liner 119 is formed on the cladding layer 117 and the top surface of the insulating material 118. The liner 119 may include a material having a k value lower than 7, such as $SiO_2$, SiN, SiCN, SiOC, or SiOCN. The liner 119 may be formed by a conformal process, such as an ALD process. A dielectric material 121 is then formed in the trenches 114 (FIG. 2) and on the liner 119. The dielectric material 121 may be an oxygen-containing material, such as an oxide, formed by FCVD. The oxygen-containing material may have a k value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Next, the liner 119 and the dielectric material 121 are recessed to the level of the topmost first semiconductor layer 106. For example, in some embodiments, after the recess process, the top surfaces of the liner 119 and the dielectric material 121 may be level with a top surface of the uppermost first semiconductor layer 106. The recess processes may be selective etch processes that do not substantially affect the semiconductor material of the cladding layer 117. As a result of the recess process, trenches 123 are formed between the fin structures 112.

Figure 4:
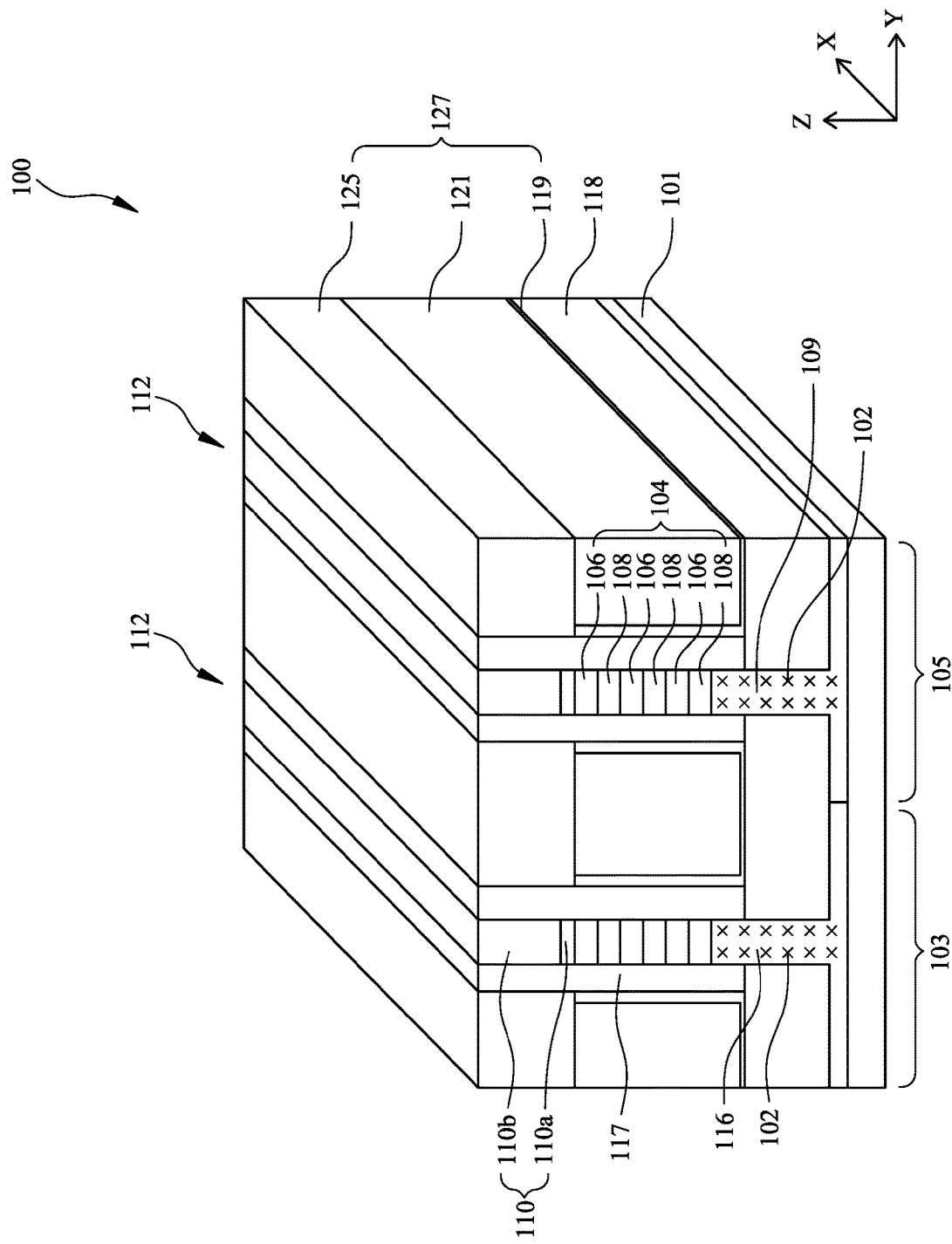

In FIG. 4, a dielectric material 125 is formed in the trenches 123 (FIG. 3) and on the dielectric material 121 and the liner 119. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves to separate subsequently formed source/drain (S/D) epitaxial features and adjacent gate electrode layers.

Figure 5:
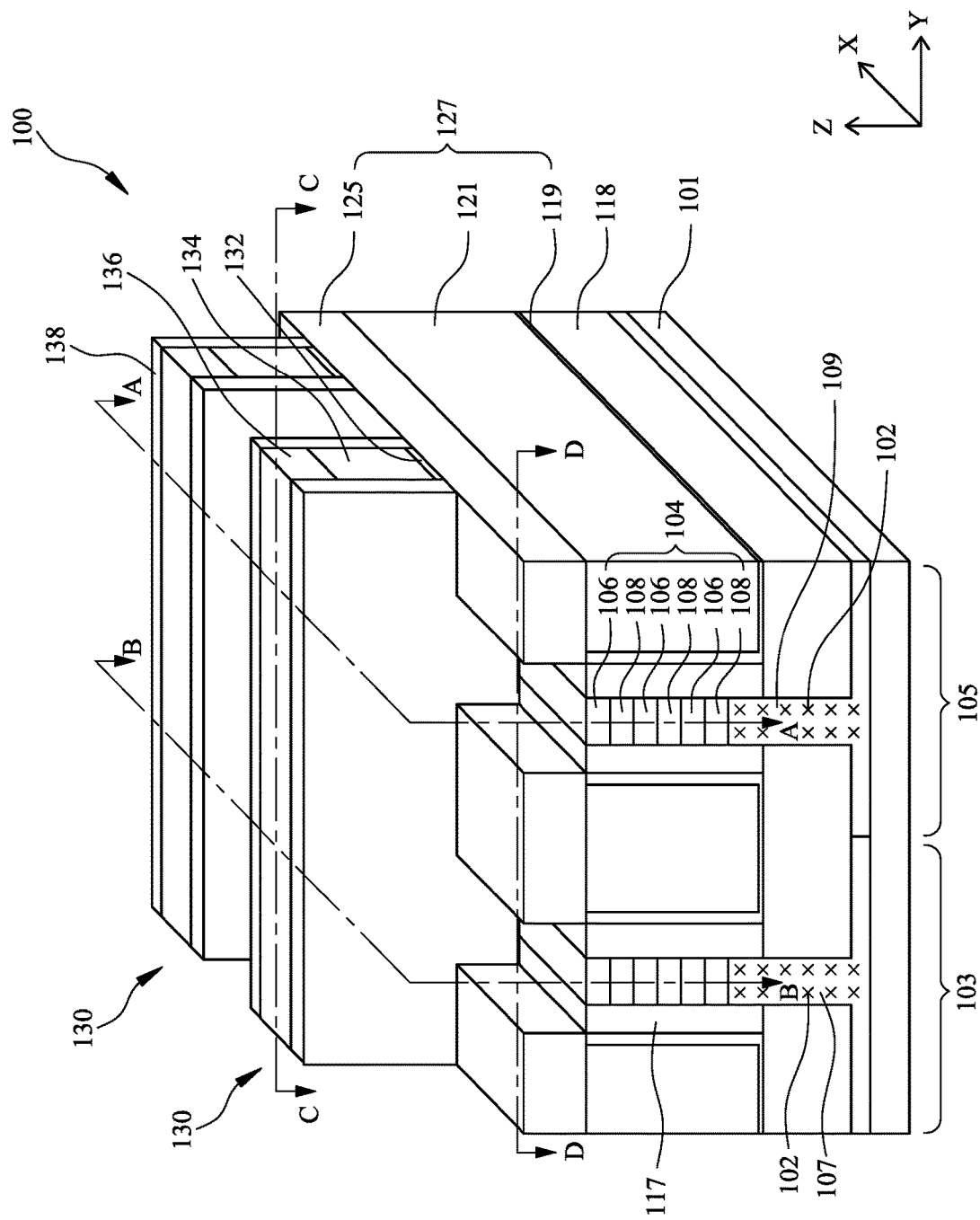
Figure 6D:
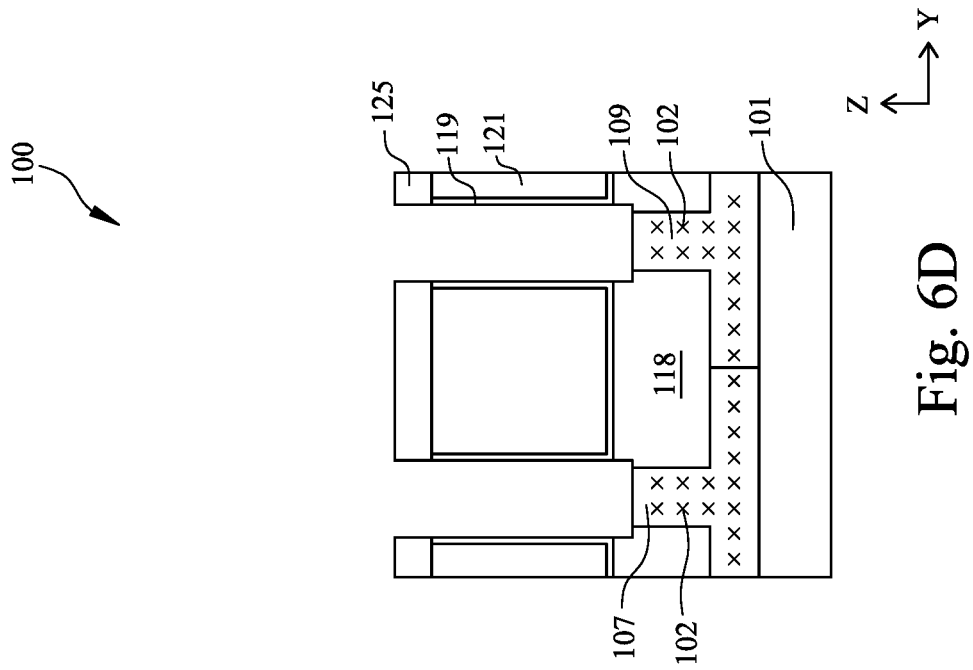
Figure 6C:
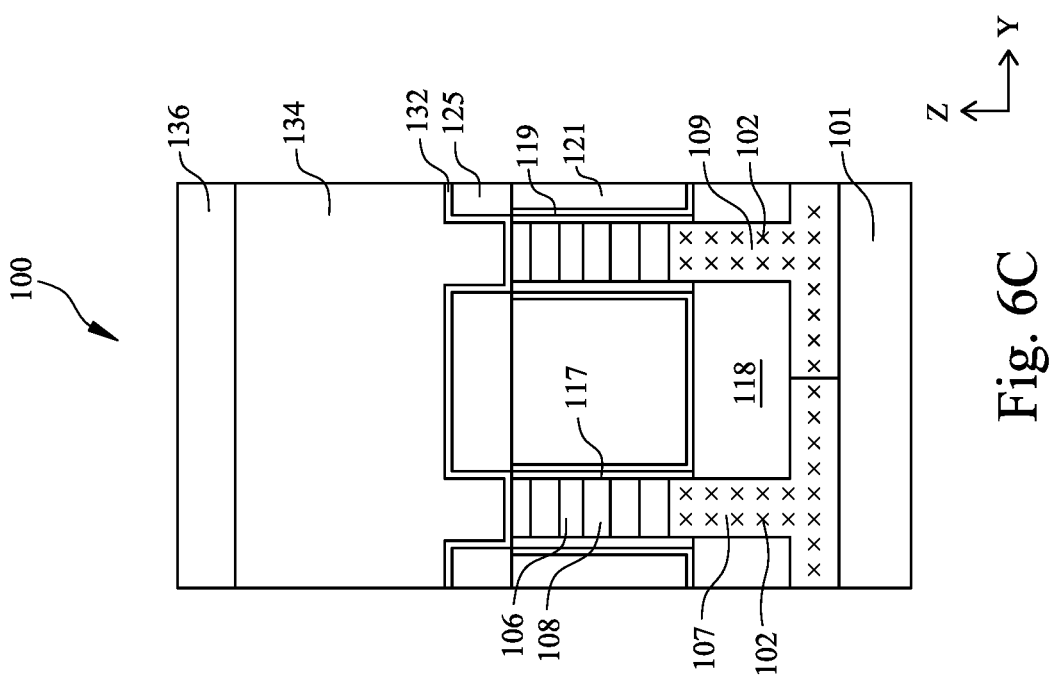
Figure 7D:
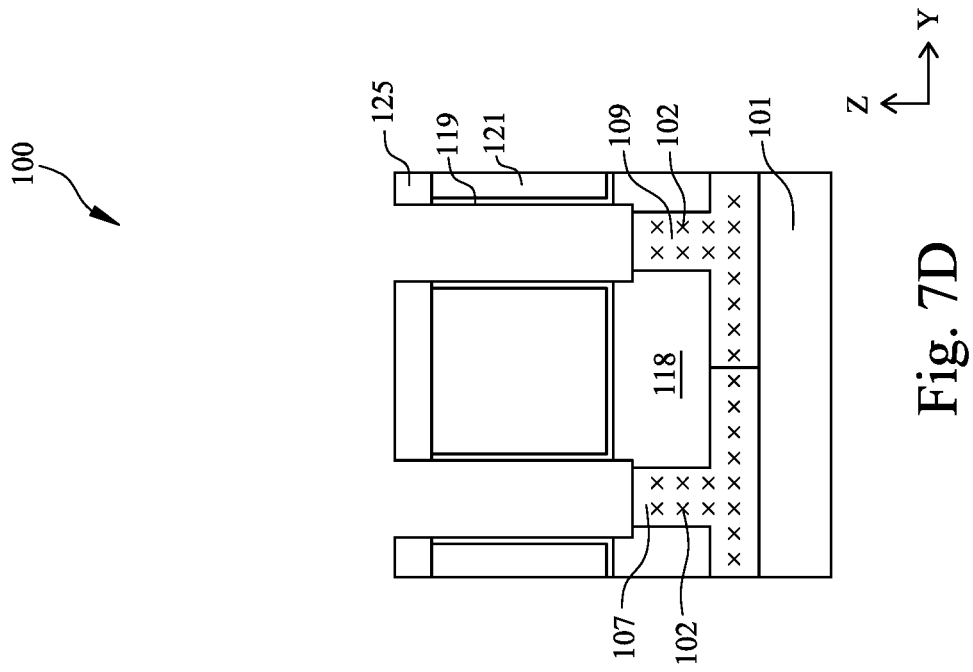
Figure 7C:
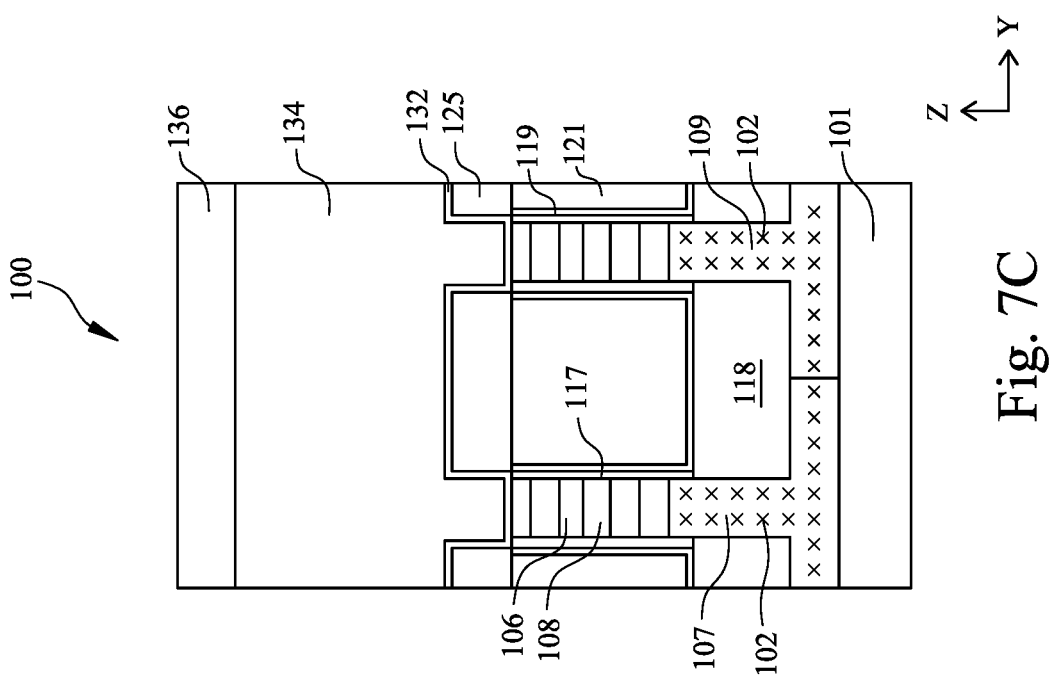

In FIG. 5, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the uppermost first semiconductor layer 106 in the stack of semiconductor layers 104. The etch process may be a selective etch process that does not substantially affect the dielectric material 125. The removal of the mask structures 110 may be performed by any suitable process, such as dry etch, wet etch, or a combination thereof.

Thereafter, one or more sacrificial gate structures 130 (only two is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While two sacrificial gate structures 130 are shown, three or more sacrificial gate structures 130 may be arranged along the X direction in some embodiments.

FIG. 5 also illustrates that gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100 by an ALD process or any suitable conformal deposition technique. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may have a thickness in a range of about 3 nm to about 12 nm. The gate spacer 138 may be made of a dielectric material such as $SiO_2$, $Si_3N_4$, SiC, SiON, SiCN, SiOCN, carbon doped oxide, nitrogen doped oxide, porous oxide, air gaps, and/or combinations thereof.

It should be understood that the cladding layers 117 and dielectric feature 127 (i.e., hybrid fin) are optional and may not be needed. In some embodiments where the cladding layers 117 and the dielectric features 127 are not present, portions of the sacrificial gate structures 130 and the gate spacers 138 are formed on the fin structures 112 insulating material 118, and gaps are formed between exposed portions of the fin structures 112.

FIGS. 6A-16A are cross-sectional side views of various stages of manufacturing the semiconductor device structure 100 taken along cross-section A-A of FIG. 5, in accordance with some embodiments. FIGS. 6B-16B are cross-sectional side views of various stages of manufacturing the semiconductor device structure 100 taken along cross-section B-B of FIG. 5, in accordance with some embodiments. FIGS. 6C-16C are cross-sectional side views of various stages of manufacturing the semiconductor device structure 100 taken along cross-section C-C of FIG. 5, in accordance with some embodiments. FIGS. 6D-16D are cross-sectional side views of various stages of manufacturing the semiconductor device structure 100 taken along cross-section D-D of FIG. 5, in accordance with some embodiments. Cross-sections A-A and B-B are in a plane of the fin structure 112 along the X direction. Cross-section C-C is in a plane perpendicular to cross-section A-A and is in the sacrificial gate structure 130. Cross-section D-D is in a plane perpendicular to cross-section A-A and is in the S/D features 146 (FIGS. 9A and 9B) along the Y-direction. Lines A-A, B-B, and C-C correspond to lines A-A, B-B, and C-C shown in a schematic layout 1400 of FIG. 14.

In FIGS. 6A-6D, exposed portions of the fin structures 112, exposed portions of the cladding layers 117, and exposed portions of the dielectric material 125 at the first and second device regions 103, 105 not covered by the sacrificial gate structures 130 and the gate spacers 138 are selectively recessed by one or more suitable etch processes, such as dry etch, wet etch, or a combination thereof. The portions of the fin structures 112, exposed portions of the cladding layers 117, exposed portions of the dielectric material 125, and a portion of the wells 107, 109 are removed to expose the sidewalls of the fin structures 112 (FIG. 4). In some embodiments, the exposed portions of the fin structures 112 are recessed to a level at or slightly below a bottom surface of the second semiconductor layer 108 in contact with the wells 107, 109 of the substrate 101, respectively. Therefore, the sidewall of the bottommost second semiconductor layer 108 of each fin structure 112 is fully exposed. In some embodiments, the removal process includes two etch processes, in which a first etch process is performed to remove the exposed portions of the stacks of semiconductor layers 104 of the fin structures 112, the cladding layers 117, and the dielectric material 125, and expose portions of the wells 107, 109, and a second etch process is performed to remove the exposed portions of the wells 107, 109. The removal of the portions of the wells 107, 109 results in recesses 157, 159 formed in the top portion of the bulk silicon region (e.g., wells 107, 109), while the top portion of the bulk silicon region under the sacrificial gate structure 130 (e.g., interface 101t) is covered and not removed. Each recess 157 has a bottom surface 157b and sidewall surfaces 157s extending upwardly from the bottom surface 157b. Each recess 159 has a bottom surface 159b and sidewall surfaces 159s extending upwardly from the bottom surface 159b. As a result of the removal of the portions of the wells 107, 109, a top surface (corresponding to the bottom surface 157b, 159b) of the exposed wells 107, 109 is at a level lower than an interface 101t defined between the bottommost second semiconductor layer 108 and the wells 107, 109 by a distance D1, D2, respectively. In some embodiments, the distance D1 and D2 is in a range from about 5 nm to about 30 nm. The sidewall surfaces 157s, 159s provide additional surface for subsequent APT dopants during the APT implantation process (FIGS. 8A and 8B) and therefore, an enhanced mitigation of junction leakage is obtained. If the distance D1, D2 is less than about 5 nm, the benefit of mitigation of junction leakage is diminished. On the other hand, if the distance D1, D2 is greater than about 30 nm, the manufacturing cost is increased without significant advantage.

In some embodiments, the removal process is performed such that the exposed wells 109 (e.g., p-type wells) at the second device region 105 are etched deeper than the exposed wells 107 (e.g., n-type wells). As channel mobility of PMOS devices (e.g., p-type gate all around transistors) is closely correlated to the dimension of source/drain (S/D) features, having the greater amount of the exposed wells 109 removed can result in the subsequent S/D features 147 (FIG. 9B) formed with greater volume, and therefore higher strain effects for PMOS devices ion improvement. In such a case, the distance D2 may be greater than the distance D1 by, for example, about 3 nm to about 15 nm.

In FIGS. 7A-7D, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon and/or SiGe having lower germanium concentration than the second semiconductor layers 108, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric layer may be made of a dielectric material that is different from the material of the gate spacers 138. The dielectric spacers 144 may be made of $SiO_2$, $Si_3N_4$, SiC, SiON, SiOC, SiCN, SiOCN, or a combination thereof. Any suitable material, such as low-k materials with a k value less than about 3.5, or even an air gap, may be utilized. The dielectric spacers 144 may have a thickness of about 3 nm to about 12 nm. In some embodiments, each dielectric spacer 144 is a single layer structure. In some embodiments, each dielectric spacer 144 is a multi-layer structure. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

In FIGS. 8A-8D, after formation of the dielectric spacers 144, the semiconductor device structure 100 is subjected to APT implantation processes 131a, 131b. The APT implantation processes 131a, 131b are performed so that the ion species (dopants) are implanted into the exposed wells 107, 109 of the substrate 101 at the source/drain (S/D) regions not covered by the sacrificial gate structures 130. The first semiconductor layers 106 remain substantially free of the additional APT dopants. The exposed wells 107, 109 have APT dopants 102 from the previous series of implant steps performed prior to formation of the stack of semiconductor layers 104. The APT implantation processes 131a, 131b implant additional APT dopants into the exposed wells 107, 109 to further reduce short channel effect of electrons or holes punching through from the source to the drain and drain-induced barrier lowering (DIBL).

Figures 1, 8B:
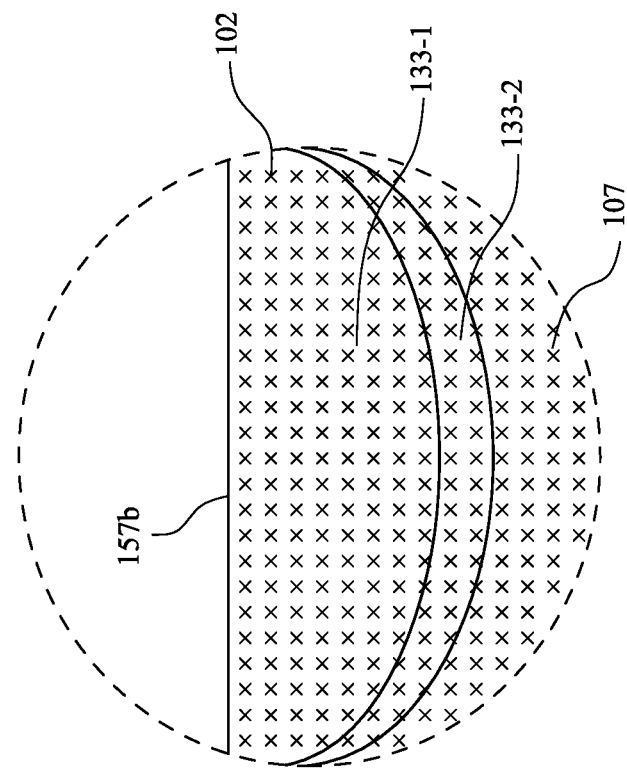
Figures 1, 8A:
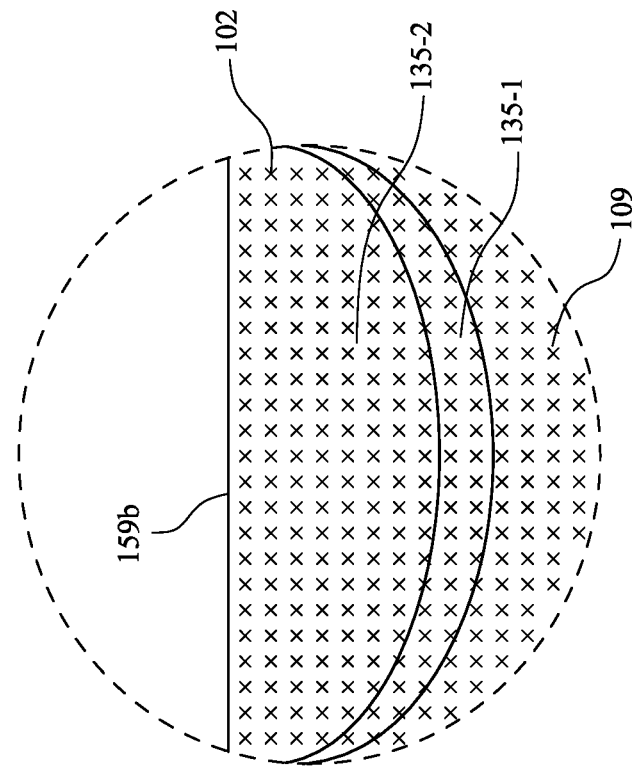
Figure 8D:
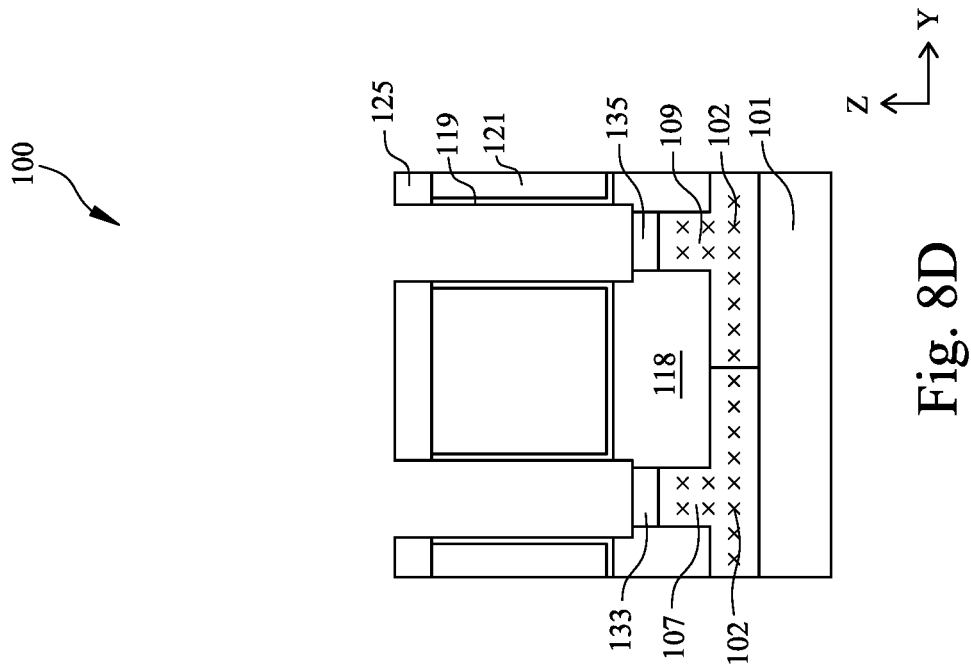
Figure 8C:
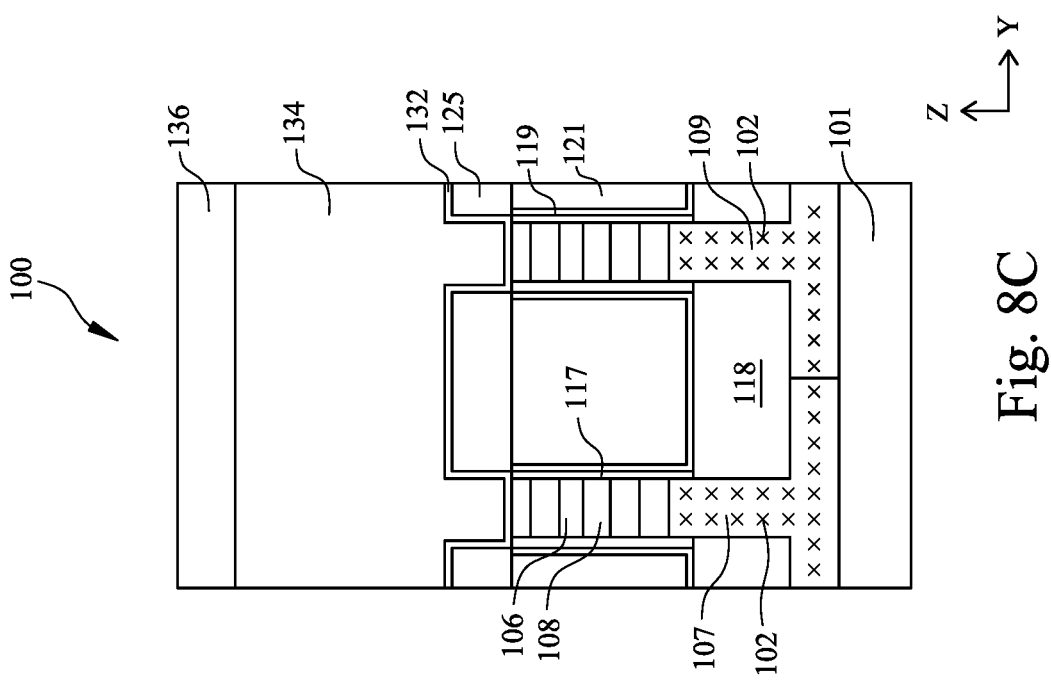
Figure 9A:
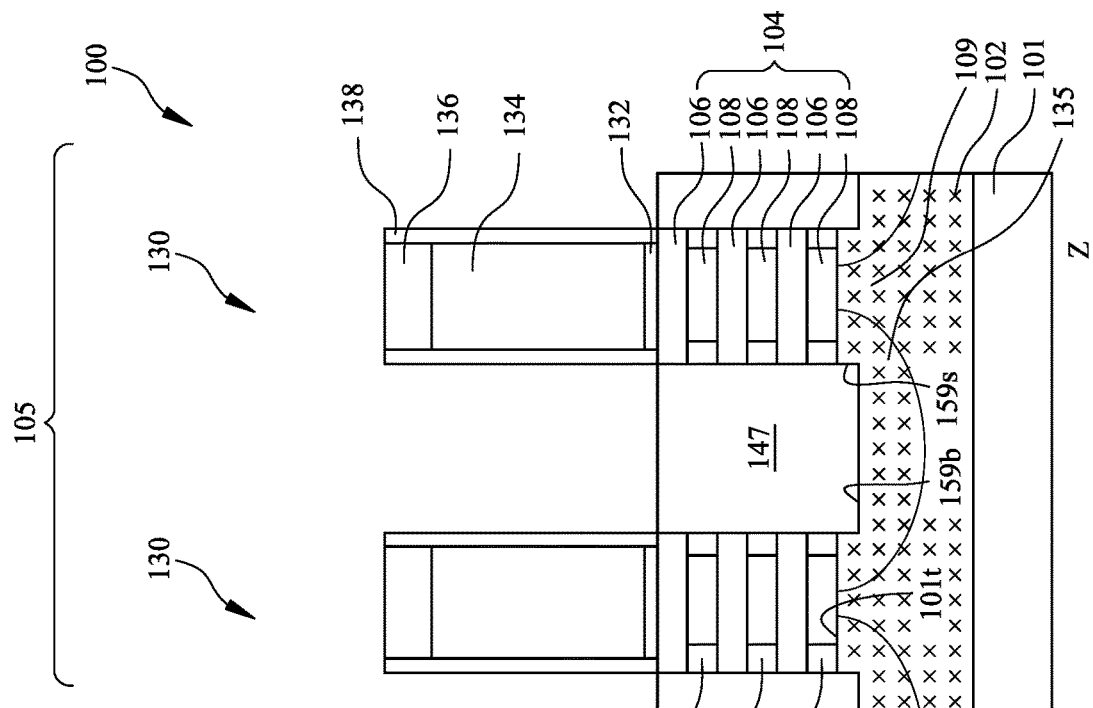
Figure 9B:
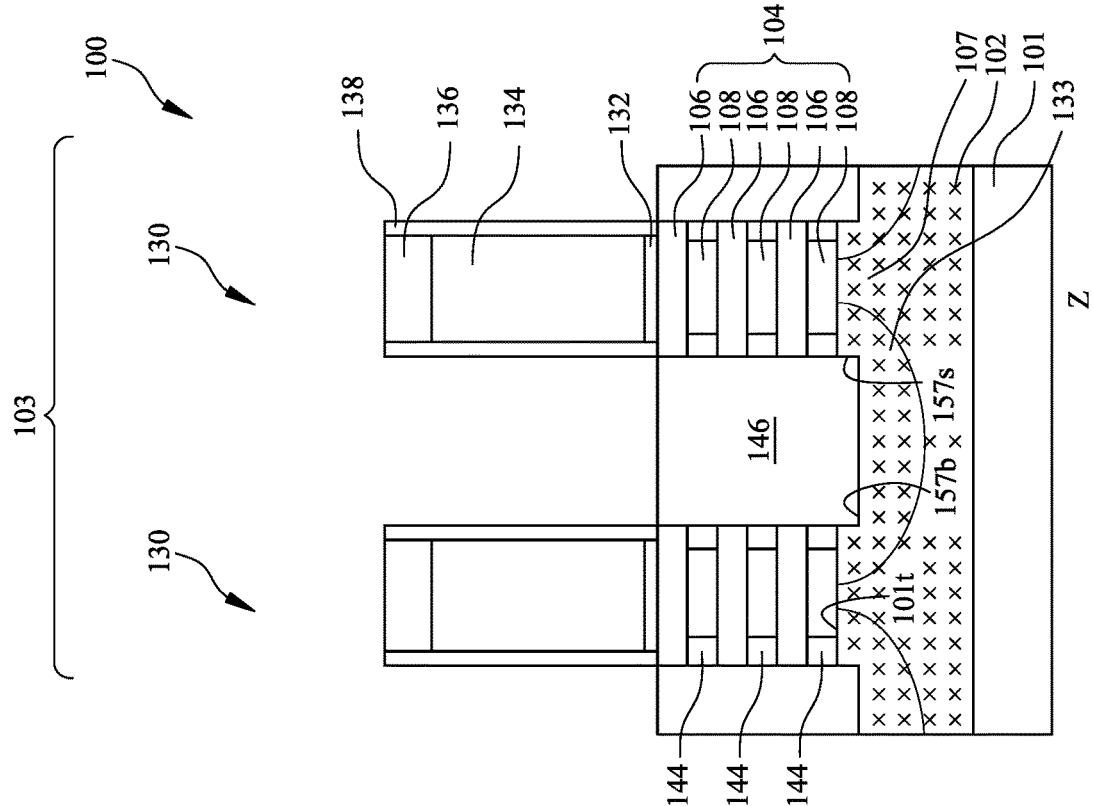
Figures 9C, 9D:
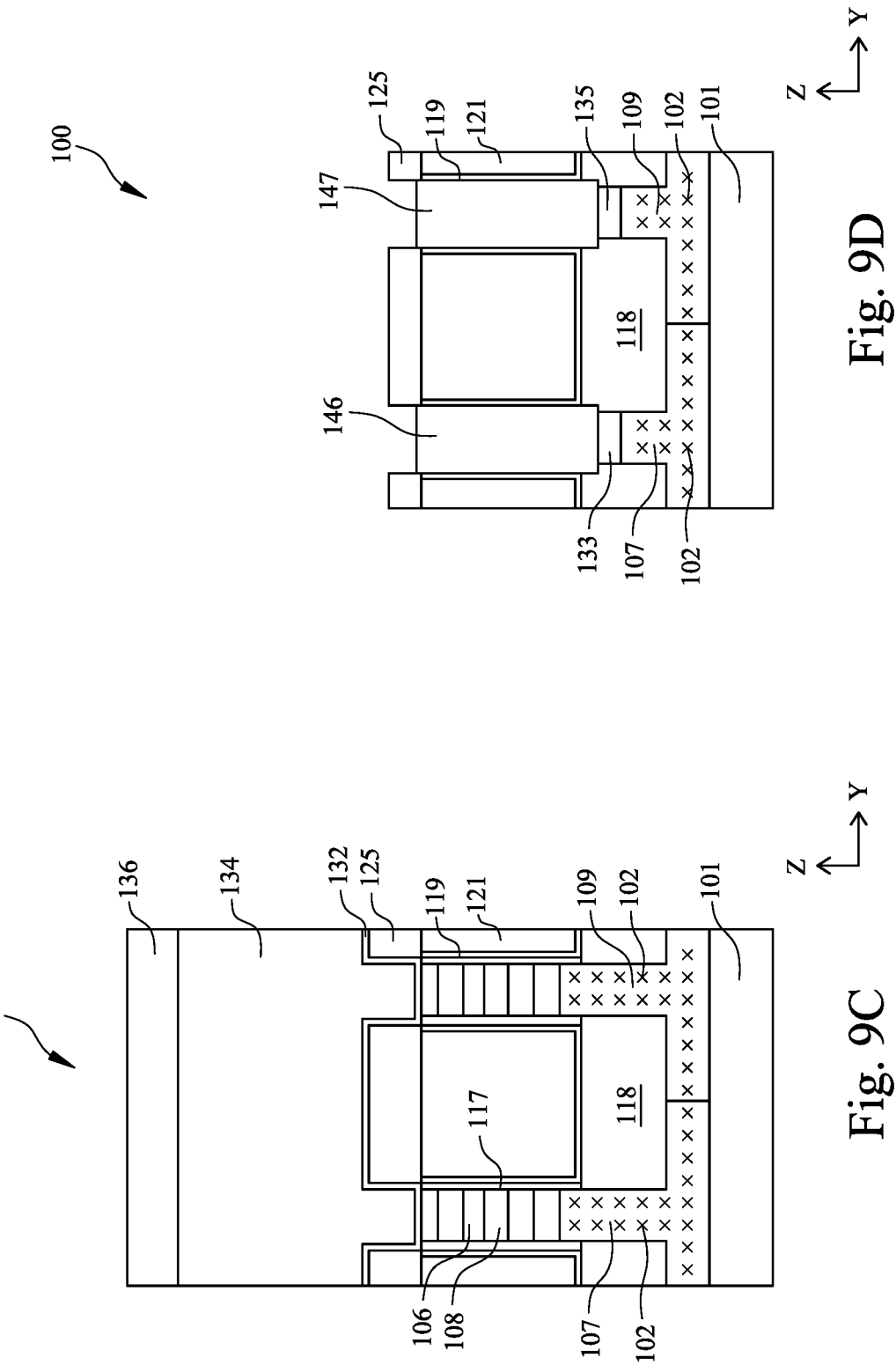
Figures 10A, 10B:
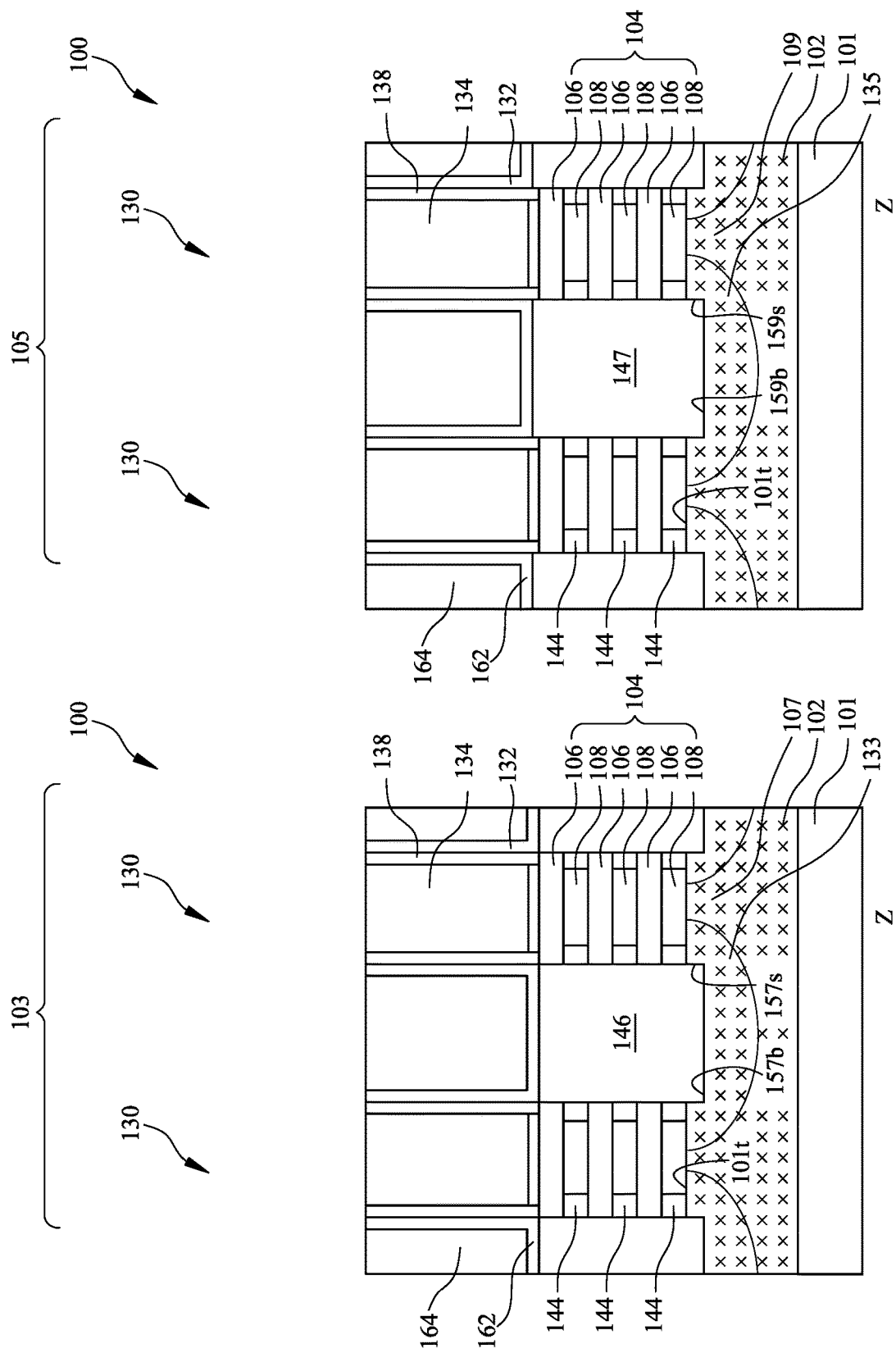
Figure 10D:
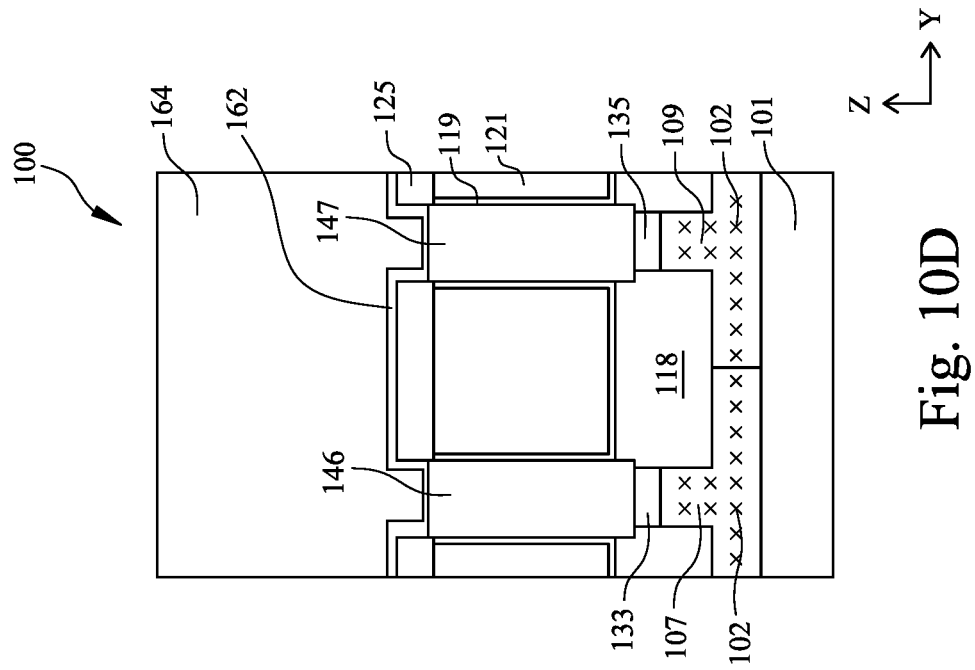
Figure 10C:
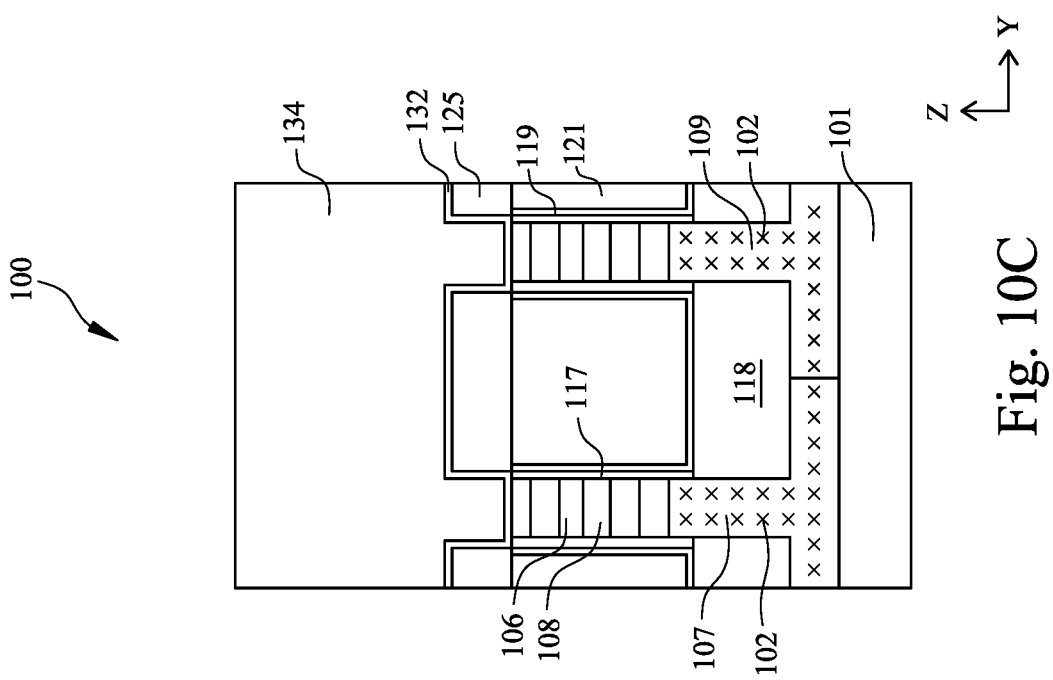

FIGS. 8A and 8B illustrate the implantation processes 131a, 131b form implant regions 133 and 135 at the wells 107 and 109, respectively. The implant regions 133 and 135 may be formed by performing the APT implantation process 131a to form the implant region 133, and then performing the APT implantation process 131b to form the implant region 135, or vice versa. The APT ion implantation process may include applying a first photoresist (not shown) over the semiconductor device structure 100 at the second device region 105 and then patterning and developing the first photoresist to form a first mask over the semiconductor device structure 100 at the second device region 105. The first mask is then used to protect the second device region 105 during a first ion implantation process (e.g., implantation process 131a), while allowing the ion species to implant into the wells 107 at the first device region 103 that is not covered by the first mask and form the implant region 133. Then, the patterned first photoresist is removed and a second photoresist (not shown) is applied over the semiconductor device structure 100 at the first device region 103. Similarly, the second photoresist is patterned and developed to form a second mask over the semiconductor device structure 100 at the first device region 103. The second mask is then used to protect the first device region 105 during a second ion implantation process (e.g., implantation process 131b), while allowing the ion species to implant into the wells 109 at the second device region 105 that is not covered by the second mask and form the implant region 135. The second mask is then removed.

The APT implantation process 131a may employ p-type dopant species, such as boron, indium, boron-containing dopant species, such as boron difluoride ($BF_2$), or a combination thereof. In some embodiments, the APT implantation process 131a may further employ carbon or carbon-containing dopant species. In one embodiment, the APT implantation process 131a employs boron and carbon dopant species. The carbon dopant species may serve to retard out-diffusion of the APT dopant species (e.g., boron) into the wells 107. The carbon dopant species thus confine the p-type dopants within the implant region 133. The p-type dopant species (e.g., boron) may be implanted at an implant dosage of between about $2E10^{13}$ atoms/cm$^2$ and about $1E10^{14}$ atoms/cm$^2$, wherein the p-type dopant may be implanted at a kinetic energy in a range of about 3 KeV to about 10 KeV. The APT implantation process 131a may be a zero-degree tilt implantation process or a tilted implantation process with a tilt angle of about zero degrees to about 15 degrees, such as about 3 degrees to about 7 degrees. The tilted implantation process allows the APT dopant species to implant into the wells 107 and the sidewall surfaces 157s. As a result, a mitigation of junction leakage is obtained.

Alternatively, the APT dopants may be formed in the wells 107 and sidewall surfaces 157s by a solid state diffusion process. In such a case, the APT implantation process may not be needed. Instead, after formation of the dielectric spacers 144, a silicon layer doped with a high doping concentration of APT dopants is grown on the wells 107 using an epitaxial growth process in a bottom-up fashion. The doped silicon layer is then subjected to a thermal treatment (e.g., a rapid thermal anneal or a laser anneal process) at a temperature range of about 700 degrees Celsius to about 1000 degrees Celsius so that the APT dopants are out-diffused from the doped silicon layer and into the wells 107 and the sidewall surfaces 157s. An etch process (e.g., RIE) may be performed to selectively remove a top portion of the silicon layer, or even the entire silicon layer, leaving the APT dopants in the sidewall surfaces 157s, or the sidewall portion of the silicon layer formed as a result of removal of the top portion of the silicon layer. Thereafter, the S/D feature 146 is epitaxially grown on the remaining silicon layer, or on the wells 107 if the silicon layer is completely removed.

While various dopant species may distribute over the implant regions 133, 135 in both lateral and vertical directions, the implant dosage and ion kinetic energy may be selected to achieve desired implant concentration profile. As a result of the APT implantation process 131a, the implant region 133 is formed with a concentration gradient profile having a first dopant concentration at region A (e.g., region underneath the to be formed S/D features 146), a second dopant concentration at region B (e.g., region underneath the dielectric spacers 144, such as sidewall surfaces 157s) disposed radial outwardly of the region A, and a third dopant concentration at region C (e.g., region underneath the bottommost second semiconductor layer 108, such as bulk silicon channel region) disposed radial outwardly of the region B, as shown in FIG. 8A, whereas the first dopant concentration is greater than the second dopant concentration, and the second dopant concentration is greater than the third dopant concentration. In some embodiments, the first dopant concentration at region A is about $1E10^{17}$ cm$^3$ to about $1E19$ cm$^3$. In some embodiments, the first dopant concentration at region A is about 1 time to about 1.5 times higher than the second dopant concentration at region B, and the second dopant concentration at region B is about 2 times to about 50 times higher than the third dopant concentration at region C.

In some embodiments where the APT implantation process is a tilted implantation process, the first dopant concentration at region A is about the same as the second dopant concentration at region B, and the second dopant concentration at region B is greater than the third dopant concentration at region C, whereas the second dopant concentration at region B is about 2 times to about 50 times higher than the third dopant concentration at region C.

FIG. 8A-1 is an enlarged view of a portion of the implant region 133 showing an exemplary dopant distribution profile according to embodiments of the present disclosure. The dopant distribution profile may include a first dopant region 133-1 disposed immediately below the exposed top surface of the well 107 (i.e., bottom surface 157b of the recess 157), and the first dopant region 133-1 consists of a majority of boron dopant species; a second dopant region 133-2 disposed between the first dopant region 133-1 and the well 107, and the second dopant region 133-2 consists of a majority of carbon dopant species. In some embodiments, the first dopant region 133-1 has a dopant concentration (e.g., p-type dopant species) higher than a dopant concentration (e.g., p-type dopant species) of the well 107, and the well 107 has a dopant concentration (e.g., p-type dopant species) higher than the dopant concentration of the second dopant region 133-2.

Likewise, the APT implantation process 131b may employ n-type dopant species, such as phosphorus, arsenic, phosphorus-containing dopant species, or a combination thereof. In some embodiments, the APT implantation process 131b may further employ carbon, carbon-containing dopant species, nitrogen, nitrogen-containing dopant species, or a combination thereof. In one embodiment, the APT implantation process 131b employs phosphorus and carbon dopant species. The carbon dopant species may serve to retard out-diffusion of the secondary dopant species (e.g., phosphorus) in the wells 109 and confine the n-type dopants within the implant region 135. In another embodiment, the APT implantation process 131b employs phosphorus and nitrogen dopant species. The nitrogen dopant species may serve to form a barrier and prevent the n-type dopants from diffusing into the well 109. The n-type dopant species (e.g., phosphorus) may be implanted at an implant dosage of between about $2E10^{13}$ atoms/cm$^2$ and about $1E10^{14}$ atoms/cm$^2$, wherein the n-type dopant may be implanted at a kinetic energy in a range of about 5 KeV to about 15 KeV. The APT implantation process 131b may be a zero-degree tilt implantation process or a tilted implantation process with a tilt angle in a range of about zero degrees to about 15 degrees, such as about 3 degrees to about 7 degrees. The tilted implantation process allows the dopant species to implant into the wells 109 and the sidewall surfaces 159s. Alternatively, the APT dopants may be formed by the solid state diffusion process discussed above.

As a result of the APT implantation process 131b, the implant region 135 is formed with a concentration gradient profile having a first dopant concentration at region A' (e.g., region underneath the to be formed S/D features 147), a second dopant concentration at region B' (e.g., region underneath the dielectric spacers 144, such as sidewall surfaces 159s) disposed radial outwardly of the region A', and a third dopant concentration at region C' (e.g., region underneath the bottommost second semiconductor layer 108, such as bulk silicon channel region) disposed radial outwardly of the region B', as shown in FIG. 8B, whereas the first dopant concentration is greater than the second dopant concentration, and the second dopant concentration is greater than the third dopant concentration. In some embodiments, the first dopant concentration at region A' is about $1E10^{17}$ cm$^3$ to about 1E19 cm$^3$. In some embodiments, the first dopant concentration at region A' is about 1 time to about 1.5 times higher than the second dopant concentration at region B', and the second dopant concentration at region B' is about 2 times to about 50 times higher than the third dopant concentration at region C'.

In some embodiments where the APT implantation process is a tilted implantation process, the first dopant concentration at region A' is about the same as the second dopant concentration at region B', and the second dopant concentration at region B' is greater than the third dopant concentration at region C', whereas the second dopant concentration at region B' is about 2 times to about 50 times higher than the third dopant concentration at region C'.

FIG. 8B-1 is an enlarged view of a portion of the implant region 135 showing an exemplary dopant distribution profile according to embodiments of the present disclosure. The dopant distribution profile may include a first dopant region 135-1 disposed immediately below the exposed top surface of the well 109 (i.e., bottom surface 159b of the recess 159), and the first dopant region 135-1 consists of a majority of phosphorus dopant species; a second dopant region 135-2 disposed between the first dopant region 135-1 and the well 109, and the second dopant region 135-2 consists of a majority of carbon dopant species. In some embodiments, the first dopant region 135-1 has a dopant concentration (e.g., n-type dopant species) higher than a dopant concentration (e.g., n-type dopant species) of the well 109, and the well 109 has a dopant concentration (e.g., n-type dopant species) higher than the dopant concentration of the second dopant region 135-2.

The implant region 133 may have a depth D3 measuring from the exposed top surface of the substrate 101 (e.g., bottom surface 157b of the recess) to a bottom of the implant region 133. In some embodiments, the depth D3 and the nanosheet channel height H1 (corresponding to thickness T2 in FIG. 1) may be at a ratio (D3:H1) of about 2:1 to about 20:1, such as about 3:1 to about 5:1. If the ratio (D3:H1) is less than about 2:1, the implant region 133 may not be sufficient to block off-state current ($I_{off}$) leakage. On the other hand, if the ratio (D3:H1) is greater than about 20:1 the manufacturing cost is increased without significant advantage.

While current in the channel regions of gate all around (GAA) transistors (e.g., nanosheet transistors) can be controlled by the gate electrode layer, the current in the wells 107, 109 and the substrate 101 cannot be effectively controlled by the gate and thus, a flow of current leakage from source to drain through the wells 107, 109 and the substrate 101 is often observed, especially when the gate is in an "off" state (i.e., gate voltage is held below the threshold voltage). In addition, it has been observed that p-type dopant species (e.g., boron) can easily out-diffuse into the STI region, adjacent silicon layer (e.g., first semiconductor layer 106), and subsequent gate dielectric region, resulting in insufficient dopants in the bulk silicon region under the gate-bulk silicon interface (e.g., non-gate surround region) and thus, worse off-state current ($I_{off}$) leakage. This phenomenon is found much worse in the NMOS devices than the PMOS devices. To compensate for the dopant out-diffuse effect, a heavy APT dopant dosage is often implanted in the bottommost planar channel region prior to formation of the stack of semiconductor layers. However, the use of heavy APT dopant dosage can induce subthreshold leakage and impact the adjacent PMOS device's bottom planar channel region.

The present inventive approach implants first APT dopants before the formation of the stack of semiconductor layers 104 at a lighter dosage and second additional APT dopants after formation of the dielectric spacers 144 (i.e., post S/D recess etch). The implantation of the additional APT dopants after the dielectric spacers 144 ensures sufficient dopant amount in the bulk silicon region without worrying about out-diffusion of the APT dopants into the bottommost channel region and create Vt mis-match issues. This is advantageous because no heavy APT dopant dosage is needed, which allows for a mitigation of junction leakage and out-diffusion impacts of the APT dosage. The use of lighter dopant dosages and the doping scheme of APT post the S/D recess etch can provide precise and effective dopant allocation in the wells 107, 109 for planar channel region off-state current ($I_{off}$) leakage control. In addition, since no heavy APT dopant dosage is used, the APT dopants are less likely to diffuse into the bottommost channel region during subsequent thermal cycles and impact both on-state current ($I_{on}$) and threshold voltage (Vt) mis-match performance.

After the APT implantation processes 131a, 131b, an optional annealing process may be performed to re-crystallize and/or repair lattice damage in the implant regions 133, 135. The annealing process may be controlled to have minimum impact on the implant regions. In some embodiments, the anneal process is a rapid thermal annealing (RTA) which heats the semiconductor device structure 100 to a target temperature range of about 550 degrees Celsius to about 1000 degrees Celsius in a short time period, for example about 20 seconds to about 60 seconds.

In FIGS. 9A-9D, S/D features 146 are formed in the S/D regions between the neighboring sacrificial gate structures 130 at the first device region 103, and S/D features 147 are formed in the S/D regions between the neighboring sacrificial gate structures 130 at the second device region 105. The S/D features 146, 147 may grow from the first semiconductor layers 106 and the wells 107, 109 having the implant regions 133, 135. The S/D features 146, 147 may be the S/D regions. For example, one of a pair of S/D features 146, 147 located on one side of the sacrificial gate structures 130 may be a source region, and the other of the pair of S/D features 146, 147 located on the other side of the sacrificial gate structures 130 may be a drain region. A pair of S/D features 146, 147 includes a source feature 146, 147 and a drain feature 146, 147 connected by the channels (i.e., the first semiconductor layers 106). Therefore, a source and a drain are interchangeably used in this disclosure.

The S/D features 146 may be formed by initially protecting the second device region 105 with a photoresist or other masking materials. Once the second device region 105 has been protected, the S/D features 146 may be formed using selective epitaxial growth (SEG), CVD, ALD, MBE, or any suitable growth process, with a semiconductor material suitable for the device desired to be formed. In one embodiment where the S/D features 146 are utilized to form an NMOS device, the S/D features 146 may be a semiconductor material such as Si, SiP, SiC, SiCP, SiPAs, or combinations thereof. Once the S/D features 146 are formed, dopants, such as n-type dopants, may be implanted into the S/D features 146 using the sacrificial gate structures 130 and the gate spacers 138 as masks. After the S/D features 146 have been formed, the S/D features 147 may be formed by removing the protection from the second device region 105 (through, e.g., ashing) and protecting the first device region 103 with a photoresist or other masking material. Once the first device region 103 has been protected, the S/D features 147 may be formed using a semiconductor material such as Si, SiGe, Ge, SiGeC, or combinations thereof. Once the S/D features 147 are formed, dopants, such as p-type dopants, may be implanted into the S/D features 147 using the sacrificial gate structures 130 and the gate spacers 138 as masks. The protection is then removed from the first device region 103.

In FIGS. 10A-10D, after formation of the S/D features 146, 147, a contact etch stop layer (CESL) 162 is conformally formed on the exposed surfaces of the semiconductor device structure 100. The CESL 162 covers the S/D features 146, 147, the gate spacers 138, and the dielectric material 125 at the first and second device regions 103, 105. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include oxide formed with tetraethyl-orthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164.

In some embodiments, gate end dielectrics 1420 (not illustrated in FIGS. 10A-10D but illustrated below with respect to FIG. 14) may be formed. In one embodiment, portions of the sacrificial gate electrode layer 134 are removed using, for example, a masking and etching process in order to cut the sacrificial gate electrode layer 134 into separate sections. Once the sacrificial gate electrode layer 134 has been cut, material for the gate end dielectrics such as SiN, $SiO_2$, TiN, SiON, nitride-based dielectrics, carbon-based dielectrics, a high-k material (having a k value ≥9), a combination thereof, or the like, is deposited and planarized to form the gate end dielectrics 1420 and separate the sacrificial gate electrode layer 134.

Once the ILD layer 164 has been deposited and any gate end dielectrics 1420 have been formed, a planarization operation, such as CMP, is performed on the semiconductor device structure 100 to remove portions of the ILD layer 164, the gate end dielectrics 1420 (if any), the CESL 162, the mask layer 136 until the sacrificial gate electrode layer 134 is exposed.

Figures 11A, 11B:
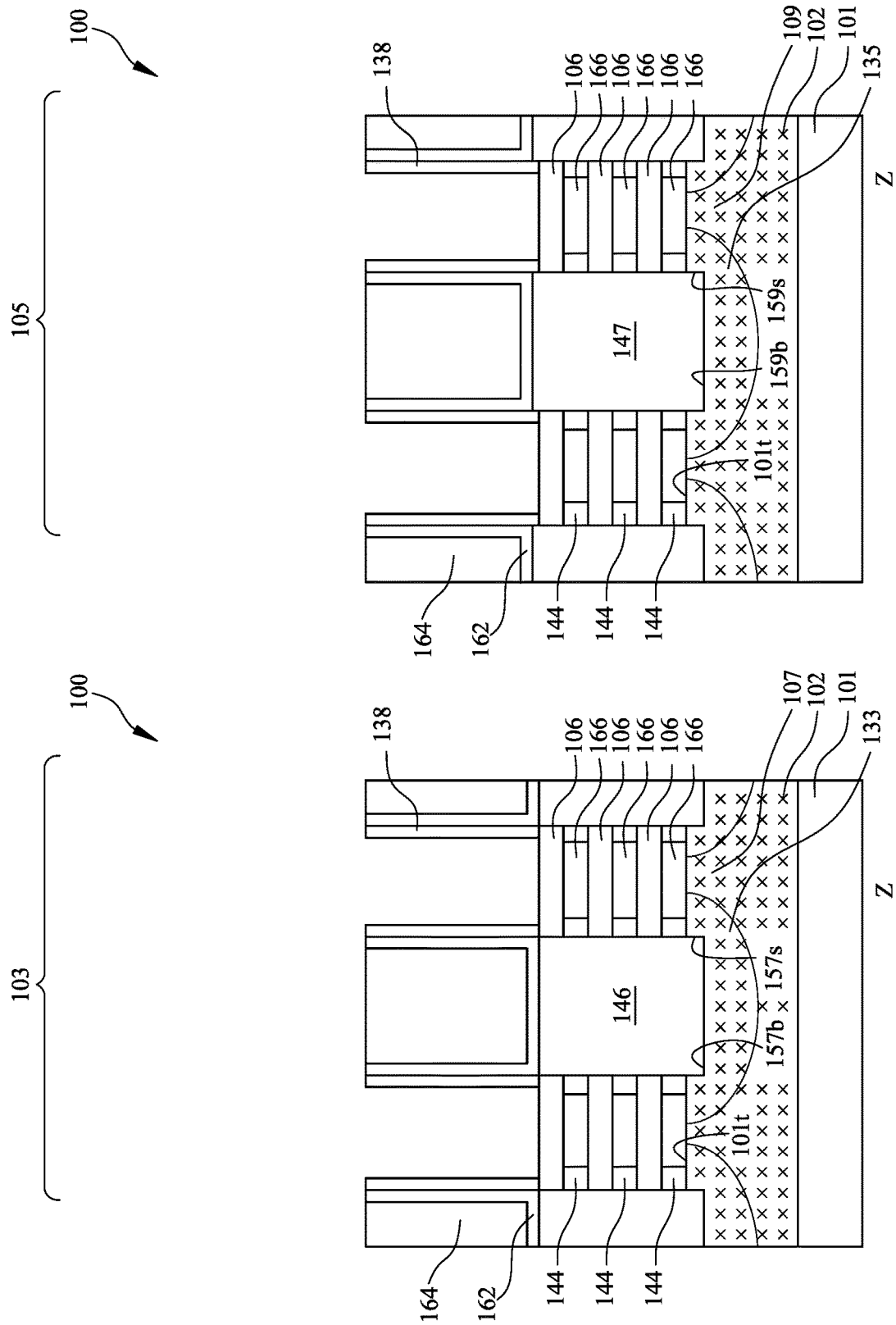

In FIGS. 11A-11C, the sacrificial gate structure 130, the cladding layer 117, and the second semiconductor layers 108 are removed from the first and second device regions 103, 105. The removal of the sacrificial gate structure 130 and the semiconductor layers 108 forms an opening 166 between gate spacers 138 and between first semiconductor layers 106. The ILD layer 164 protects the S/D epitaxial features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, the ILD layer 164, and the CESL 162. In some embodiments, the gate spacers 138 may be recessed by the etchant used to remove the sacrificial gate electrode layer 134 and/or the sacrificial gate dielectric layer 132.

After the removal of the sacrificial gate structure 130, the cladding layers 117 and the second semiconductor layers 108 are exposed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may use an etchant that selectively removes the cladding layers 117 and the second semiconductor layers 108 without substantially removing the gate spacers 138, the ILD layer 164, the CESL 162, the dielectric material 125, and the first semiconductor layers 106. In one embodiment where the first semiconductor layers 106 is Si and the second semiconductor layers 108 is SiGe, the etchant may be a hydrochloric acid (HCl) or any suitable etchant. As a result, a portion of the first semiconductor layers 106 not covered by the dielectric spacers 144 is exposed in the opening 166.

Figures 12A, 12B:
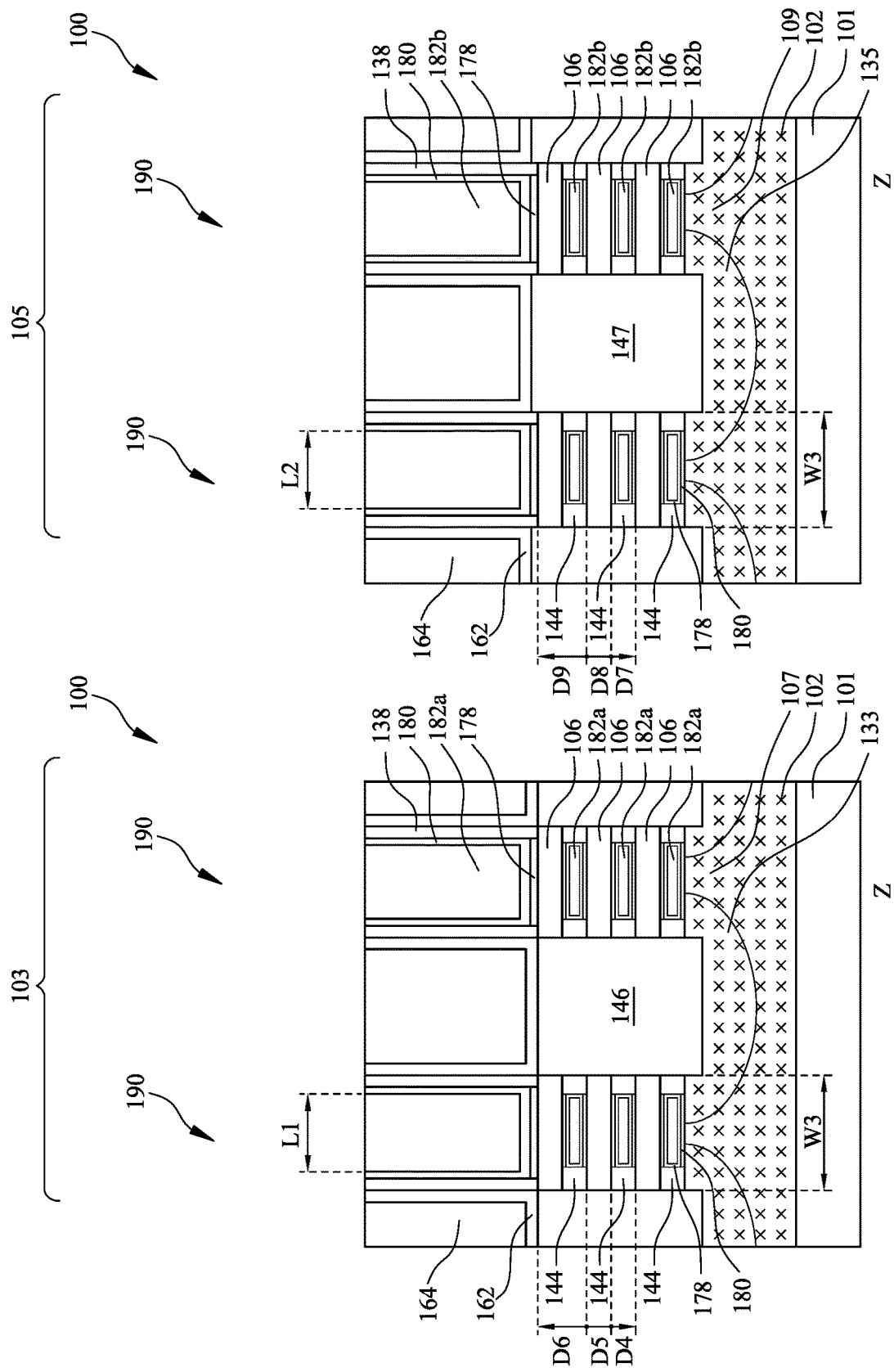

In FIGS. 12A-12D, replacement gate structures 190 are formed at the first and second device regions 103, 105. The replacement gate structures 190 each includes an interfacial layer (IL) 178, a gate dielectric layer 180, and a gate electrode layer 182a/182b. The interfacial layer (IL) 178 is formed to surround exposed surfaces of the first semiconductor layers 106. The IL 178 also forms on the wells 107, 109 (and the implant regions 133, 135) of the substrate 101. The IL 178 may include or be made of an oxygen-containing material or a silicon-containing material, such as silicon oxide, silicon oxynitride, oxynitride, hafnium silicate, etc. In one embodiment, the IL 178 is silicon oxide. The IL 178 may be formed by CVD, ALD, a clean process, or any suitable process. Next, the gate dielectric layer 180 is formed on the exposed surfaces of the semiconductor device structure 100. In some embodiments, the gate dielectric layer 180 is formed to wrap around and in contact with the IL 178. The gate dielectric layer 180 also forms on and in contact with the liner 119 and the dielectric material 125 (FIGS. 12C and 12D). The gate dielectric layer 180 may include or made of a high-k dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide ($Al_2O_3$), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), oxide with nitrogen doped dielectrics combined with metal content high-k dielectric (having a k value >13), or other suitable dielectrics having a k value ≥9. The gate dielectric layer 180 may be a conformal layer formed by a conformal process, such as an ALD process or a CVD process. The gate dielectric layer 180 may have a thickness in a range of about 0.5 nm to about 3 nm.

After formation of the IL 178 and the gate dielectric layer 180, the gate electrode layer 182*a*/182*b* is formed on the gate dielectric layer 180. The gate electrode layer 182*a* may be formed to fill the openings 166 (FIGS. 11A and 11B) and surround a portion of each of the first semiconductor layers 106 at the first device region 103. The gate electrode layer 182*b* may be formed to fill the openings 166 and surround a portion of each of the first semiconductor layers 106 at the second device region 105. In some embodiments, the gate electrode layers 182*a*, 182*b* may be formed using multiple layers, each layer deposited sequentially adjacent to each other using a highly conformal deposition process such as ALD. Other deposition technique such as PVD, CVD, or electro-plating may also be used. While not shown, the gate electrode layer 182*a* may include a capping layer, a barrier layer, an n-metal work function layer, a p-metal work function layer, and a fill material.

The capping layer may be formed adjacent to the gate dielectric layer 180 and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be formed adjacent the capping layer, and may include a material for forming the capping layer. In some embodiments, the barrier layer may be formed of a material different from the capping layer. The n-metal work function layer may be formed adjacent to the barrier layer and may be formed from a metallic material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. The p-metal work function layer may be formed adjacent to the n-metal work function layer and may be formed from a metallic material such as W, Al, Cu, TiN, Ti, TiAlN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, Of the like. Once the p-metal work function layer has been formed, the fill material is deposited to fill a remainder of the opening 166. The fill material may be a material such as W, Al, Cu, AlCu, W, Ti, TiAlN, TaC, TaCN, TaSiN, Mn, Zr, TiN, Ta, TaN, Co, Ni, combinations of these, or the like.

Similarly, the gate electrode layer 182*b* may be formed using multiple layers. The gate electrode layer 182*b* may be formed using the capping layer, the barrier layer adjacent to the capping layer, the p-metal work function layer adjacent to the barrier layer, the n-metal work function layer adjacent to the p-metal work function layer, and the fill material discussed above. In some embodiments, one or more of the layers within the gate electrode layer 182*a* and the gate electrode layer 182*b* may be formed during a same series of steps. For example, the capping layers and the barrier layers in both of the gate electrode layer 182*a* and the gate electrode layer 182*b* may be formed simultaneously, while other layers such as the n-metal work function layer and the p-metal work function layer may be formed and/or patterned independently of each other. Any suitable combination of depositions and removals may be utilized to form the gate electrode layer 182*a* and the gate electrode layer 182*b*.

Once the openings 166 have been filled, the materials of the gate electrode layer 182*a* and the gate electrode layer 182*b* may be planarized by a planarization process (e.g., CMP) to remove any material that is outside of the openings left behind by the removal of the sacrificial gate electrode layer 134.

As such, the gate stack of the IL 178, the gate dielectric layer 180, and the gate electrode layer 182*a* (including any interfacial layers) located between two adjacent first semiconductor layers 106 may have a sheet distance D4 in a range of about 6 nm to about 15 nm. The first semiconductor layer 106 at the first device region 103, after formation of the S/D features 146, may have a sheet channel thickness D5 that is equal to the sheet distance D4, and a sheet channel width W3 in a range of about 4 nm to about 70 nm. The vertical sheet pitch D6, which is defined as the sum of the D4 and D5, may be in a range of about 10 nm to about 23 nm. The length L1 of the gate electrode layer 182*a* may be in a range of about 3 nm to about 30 nm. Likewise, the gate stack of the IL 178, the gate dielectric layer 180, and the gate electrode layer 182*b* (including any interfacial layers) located between two adjacent first semiconductor layers 106 may have a sheet distance D7 in a range of about 6 nm to about 15 nm. The first semiconductor layer 106 at the second device region 105, after formation of the S/D features 147, may have a sheet channel thickness D8 that is equal to the sheet distance D7, and a sheet channel width W4 in a range of about 4 nm to about 70 nm. The vertical sheet pitch D9, which is defined as the sum of the D7 and D8, may be in a range of about 10 nm to about 23 nm. The length L2 of the gate electrode layer 182*b* may be in a range of about 3 nm to about 30 nm. The length L1 may be equal to or less than the length L2.

In some embodiments, portions of the first semiconductor layers 106 adjacent to the S/D features 146, 147 may have p-type or n-type dopants diffused from the S/D features 146, 147. The portions of the first semiconductor layers 106 adjacent to the S/D features 146, 147, e.g., regions disposed between the dielectric spacers 144 or between the dielectric spacers 144 and the gate spacers 138, may serve as lightly doped source/drain (LDD) regions 168 to minimize the hot carrier effect. The dopant concentration at the LDD regions 168 is less as compared to the S/D regions 146, 147. The LDD regions 168 contain p-type or n-type dopants that are diffused naturally from the S/D features 146, 147 during subsequent thermal cycles.

Figures 13A, 13B:
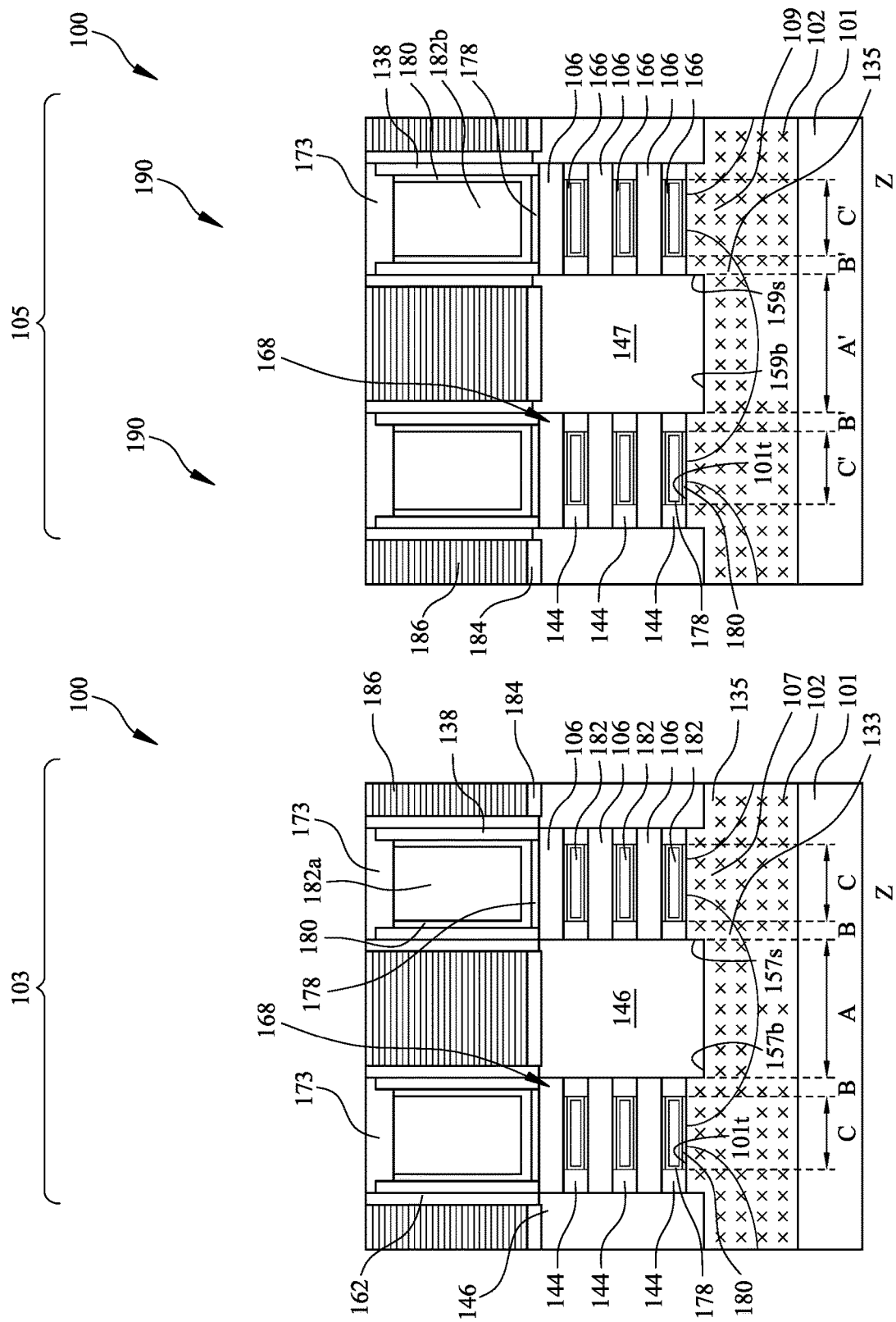
Figure 13D:
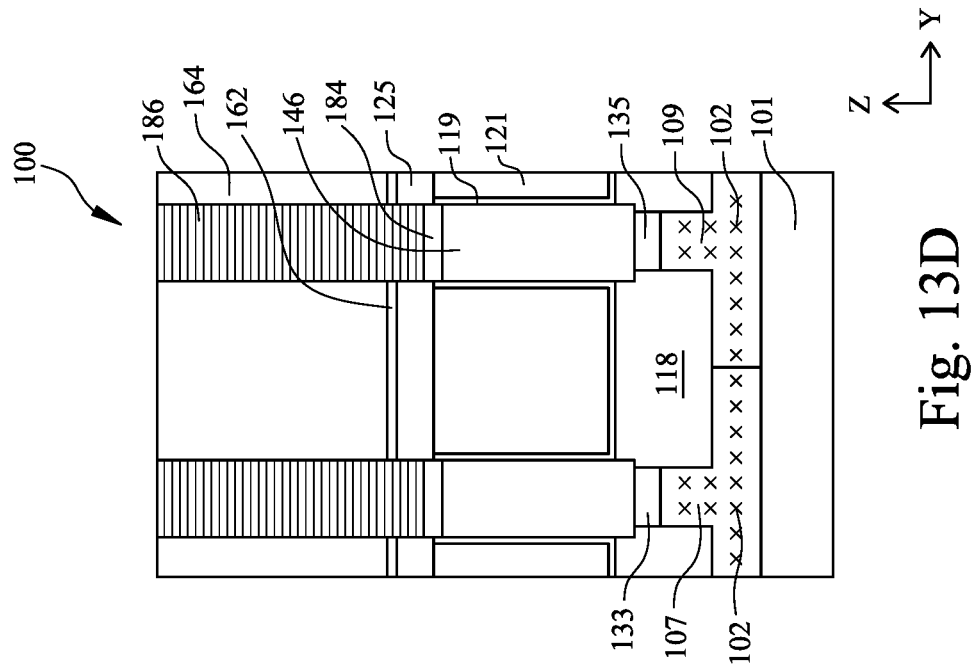
Figure 13C:
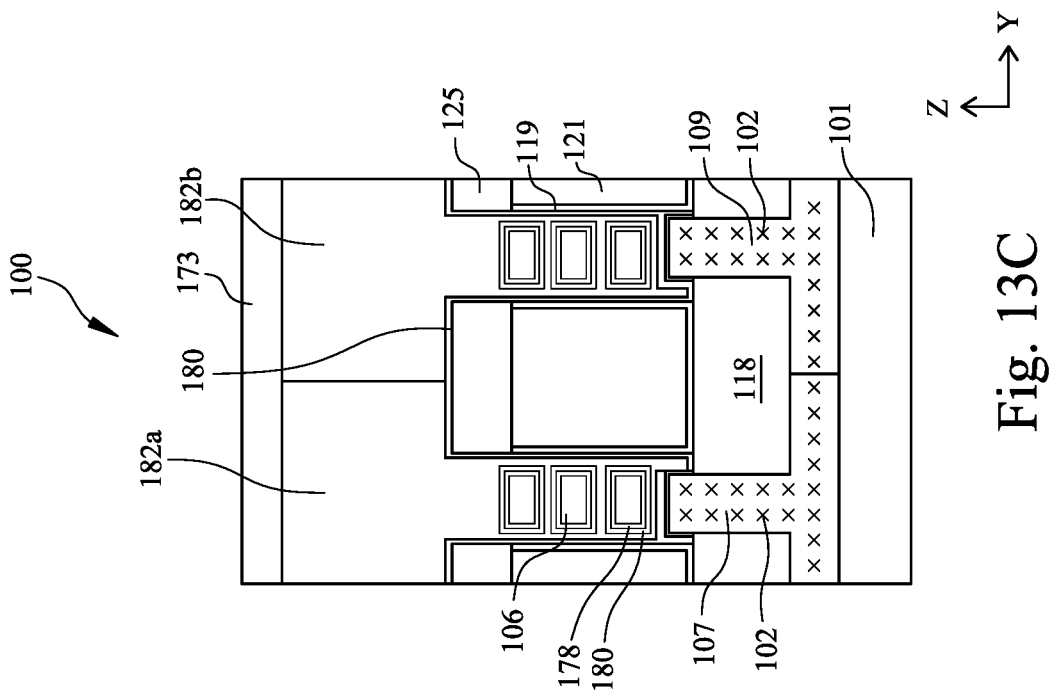

In FIGS. 13A-13D, the gate electrode layer 182*a*, 182*b* may be subject to one or more metal gate etching back (MGEB) processes. The MGEB processes are performed so that the top surfaces of the gate electrode layer 182*a*, 182*b* and the gate dielectric layer 180 are recessed to a level below the top surface of the gate spacers 138. In some embodiments, the gate spacers 138 are also recessed to a level below the top surface of the ILD layer 164, as shown in FIGS. 13A and 13B. A self-aligned contact layer 173 is formed over the gate electrode layer 182*a*, 182*b* and the gate dielectric layer 180 between the gate spacers 138. The self-aligned contact layer 173 may be a dielectric material having an etch selectivity relative to the ILD layer 164. In some embodiments, the self-aligned contact layer 173 may be a dielectric material such as silicon nitride or a high-k dielectric layer. Once formed, the self-aligned contact layer 173*a* may be planarized using a planarization process such as a CMP.

After formation of the self-aligned contact layer 173, contact openings are formed through the ILD layer 164 and the CESL 162 to expose the epitaxial S/D feature 146, 147. A silicide layer 184 is then formed on the S/D epitaxial feature 146, 147, and a contact 186 is formed in the contact opening on the silicide layer 184. The contact 186 may include an electrically conductive material, such as Al, Cu, W, Co, Ti, Ta, Ru, TiN, TiAl, TiAlN, TaN, TaC, NiSi, CoSi, combinations of these, or the like. The silicidation may be performed by blanket deposition of an appropriate metal layer, followed by an annealing step which causes the metal to react with the underlying exposed silicon. Un-reacted metal is then removed, such as with a selective etch process. The contact 186 may be formed in the contact openings using sputtering, CVD, electroplating, electroless plating, or the like, to fill and/or overfill the contact openings. Any deposited material outside of the contact openings may be removed using a planarization process, such as a CMP.

The semiconductor device structure 100 may then undergo further complementary metal oxide semiconductor (CMOS) and/or back-end-of-line (BEOL) processes to form various features such as transistors, contacts/vias, interconnect metal layers, dielectric layers, passivation layers, etc.

By forming the GAA transistors with additional APT dopants implanted in wells 107, 109 with a higher dopant concentration under the S/D features 146, 147 and the dielectric spacers 144 and a lower dopant concentration under the gate-planar channel interface (e.g., interface 101*t*), high performance may be achieved with short channel devices. For example, the APT dopants 102 at the wells 107, 109 and additional APT dopants in the implant regions 133, 135 ensure sufficient dopant amount in the bulk silicon region without worrying about out-diffusion of the APT dopants into the bottommost channel region during subsequent thermal cycles. In addition, since this two-stage APT implantation process does not require heavy APT dopant dosage in the bottommost planar channel region prior to formation of the stack of semiconductor layers, various issues that may be induced by APT doping diffusion during fabrication of GAA transistors, such as bottom sheet voltage threshold (Vt) shift, junction leakage, APT dopant out-diffusion and implant contamination in the channel region, are mitigated.

Figure 14:
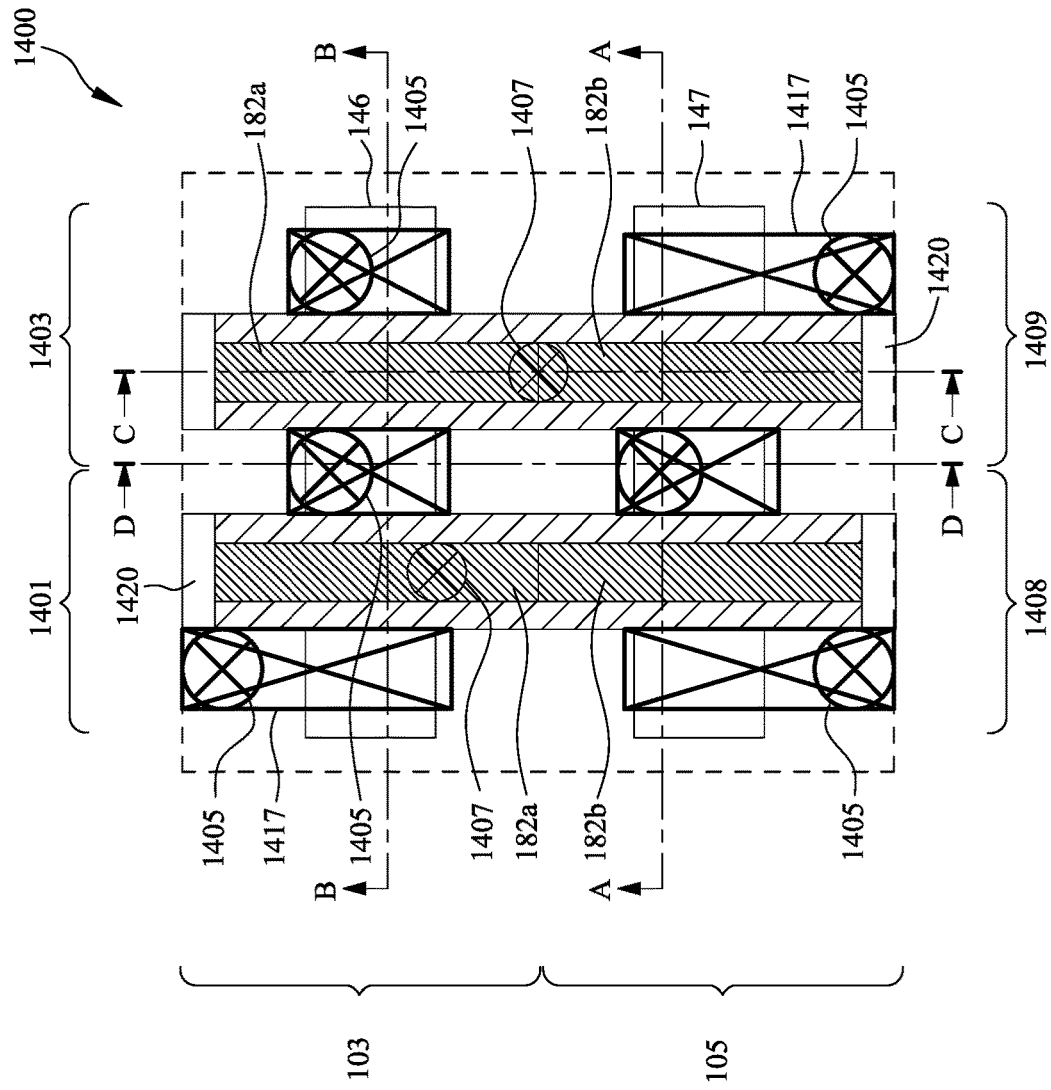
Figure 15D:
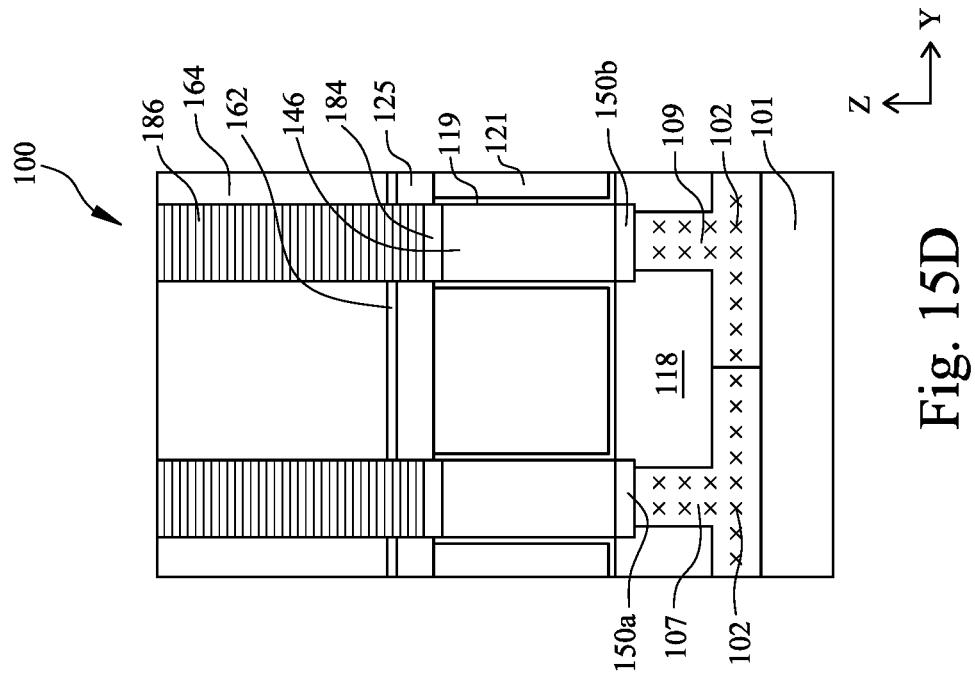
Figure 15C:
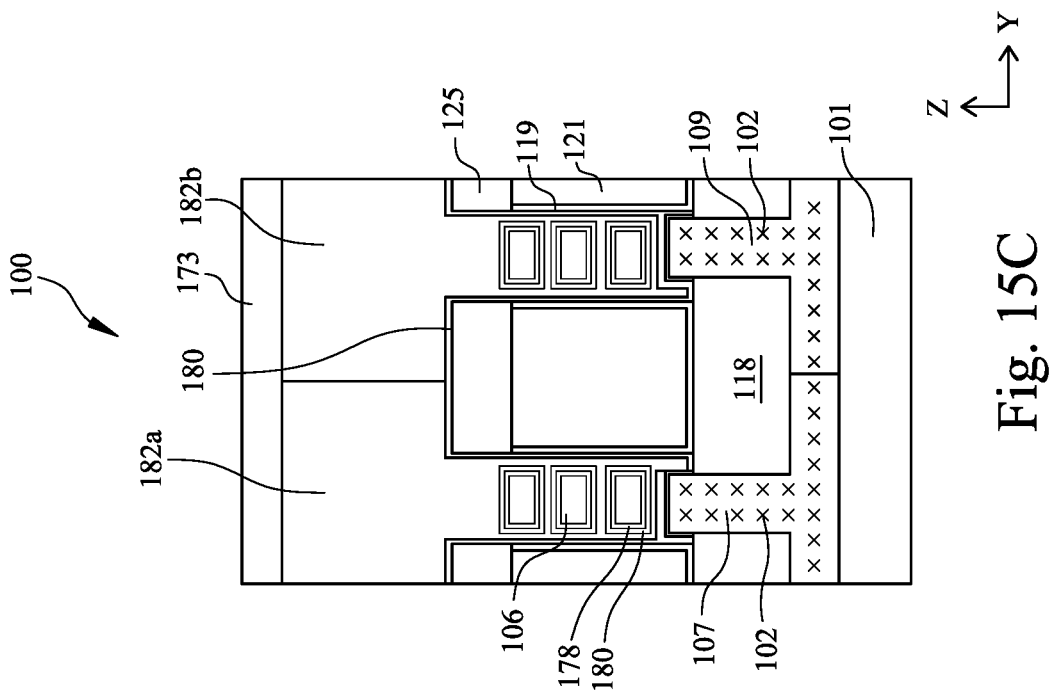

FIG. 14 illustrates a top down view of NMOS gate all around transistors formed together with PMOS gate all around transistors, in accordance with some embodiments. In one embodiment, the first device region 103 is utilized to form a first NMOS gate all around transistor 1401 and a second NMOS gate all around transistor 1403. Both the first and second NMOS gate all around transistors 1401, 1403 utilize the same combination of first semiconductor layers 106 and S/D features 146, with multiple ones of the gate electrode layer 182*a* formed over the same combination of the first semiconductor layers 106 and the S/D features 146. The first semiconductor layers 106 are covered by the gate electrode layer 182*a* and therefore are not visible. The S/D features 146 are formed to make electrical connection with each of the S/D features 146 within the first device region 103, and S/D vias 1405 and gate vias 1407 are formed to provide electrical connectivity.

The second device region 105 is utilized to form a first PMOS gate all around transistor 1408 and a second PMOS gate all around transistor 1409. Both the first and second PMOS gate all around transistors 1408, 1409 utilize the same combination of first semiconductor layers 106 and S/D features 147, with multiple ones of the gate electrode layer 182*b* formed over the same combination of the first semiconductor layers 106 and the S/D features 147. The first semiconductor layers 106 are covered by the gate electrode layer 182*b* and therefore are not visible. Additionally, the S/D contacts 1417 are formed to make electrical connection with each of the S/D features 147 within the second device region 105 and the S/D vias 1405, and the gate vias 1407 are formed to provide electrical connectivity.

FIGS. 15A-15D illustrate, in accordance with another embodiment in which a non-doped silicon layer 150*a*, 150*b* is formed between the wells 107, 109 and the S/D features 146, 147. In this embodiment, the processes are substantially identical to various embodiments shown in FIGS. 1 to 6A-6D except that no APT implantation process (e.g., APT implantation processes 131*a*, 131*b* in FIGS. 8A-8D) is performed after the dielectric spacers 144 are formed. Instead, a non-doped silicon layer 150*a*, 150*b* is formed on the exposed wells 107, 109 within the recess 157, 159, respectively. The non-doped silicon layer 150*a*, 150*b* may be formed using selective epitaxial growth (SEG), CVD, ALD, MBE, or any suitable growth process. After the non-doped silicon layer 150*a*, 150*b* is formed, the S/D features 146, 147 are formed on the non-doped silicon layer 150*a*, 150*b*. The non-doped silicon layer 150*a*, 150*b* serves to prevent the short channel effect of electrons or holes punching through from the source to the drain. As a result, the device performance is increased and the power consumption is minimized. The non-doped silicon layer 150*a*, 150*b* may have a height in a range of about 5 nm to about 35 nm. The non-doped silicon layer 150 at the first device region 103 may have a height H2 and the non-doped silicon layer 150 at the second device region 105 may have a height H3. In some embodiments, the height H2 is substantially equal to the height H3. In some embodiments, the height H3 is greater than the height H2. In such a case, the ratio of the height H2 to H3 may be in a range of about 1:1.2 to about 1:3, for example about 1:2.

In some embodiments, the height H2 and the sheet channel thickness D5 may be at a ratio (H2:D5) of about 2:1 to about 20:1, such as about 3:1 to about 5:1. If the ratio (H2:D5) is less than about 2:1, the non-doped silicon layer 150 may not be sufficient to block off-state current ($I_{off}$) leakage. On the other hand, if the ratio (H2:D5) is greater than about 20:1 the manufacturing cost is increased without significant advantage.

Various embodiments or examples described herein offer multiple advantages over the state-of-art technology. According to embodiments of the present disclosure, first APT dopants having a lighter dosage are implanted into a substrate before formation of a stack of semiconductor layers 104 and second additional APT dopants are implanted into the substrate after S/D recess etch. This two-stage APT implantation process ensures sufficient dopant amount is provided in the bulk silicon region, which allows for a mitigation of junction leakage and out-diffusion impacts of the APT dosage. The use of lighter dopant dosages and the doping scheme of APT post S/D recess etch can provide precise and effective dopant allocation in the substrate for planar channel region off-state current ($I_{off}$) leakage control. In addition, since no heavy APT dopant dosage is used, the APT dopants are less likely to diffuse into the bottommost channel region during subsequent thermal cycles and impact both on-state current ($I_{on}$) and threshold voltage (Vt) mismatch performance.

An embodiment is a semiconductor device structure. The semiconductor device structure includes a first source/drain feature over a first device region of a substrate, a plurality of first semiconductor layers over the first device region of the substrate, and each first semiconductor layer of the plurality of the first semiconductor layers being in contact with the first source/drain feature, a first gate electrode layer surrounding a portion of each of the plurality of the first semiconductor layers, and a first dielectric spacer contacting the first source/drain feature, the first dielectric spacer being disposed between and in contact with two first semiconductor layers of the plurality of the first semiconductor layers. The substrate comprises a first dopant region disposed underneath the first source/drain feature and a second dopant region disposed underneath first gate electrode layer and radial outwardly of the first dopant region, the first dopant region comprising first dopants having a first conductivity type and a first dopant concentration and the second dopant region comprising the first dopants having a second dopant concentration that is less than the first dopant concentration.

Another embodiment is a semiconductor device structure. The semiconductor device structure includes a source/drain epitaxial feature over a substrate, a plurality of semiconductor layers over the substrate, and each semiconductor layer of the plurality of the semiconductor layers being in contact with the source/drain epitaxial feature, a gate electrode layer surrounding a portion of one of the plurality of the semiconductor layers, and a non-doped silicon layer. The non-doped silicon layer comprises a first side in contact with a first side of the source/drain epitaxial feature, a second side opposing the first side and in contact with the substrate, a third side in contact with the substrate, and a fourth side opposing the third side and in contact with the substrate.

A further embodiment is a method for forming a semiconductor device structure. The method includes implanting first anti-punch through dopants into a substrate at a first kinetic energy and a first implant dosage, forming a stack of semiconductor layers over the substrate, the stack of the semiconductor layers comprising a plurality of first semiconductor layers and a plurality of second semiconductor layers alternatingly stacked, forming a fin structure from the stack of the semiconductor layers and the substrate, forming a sacrificial gate structure over a portion of the fin structure, removing portions of the fin structure not covered by the sacrificial gate structure to expose a portion of the substrate containing the first anti-punch through dopants, replacing an edge portion of the second semiconductor layers of the fin structure with a dielectric spacer, implanting second anti-punch through dopants into the portion of the substrate at a second kinetic energy and a second implant dosage, the second kinetic energy and the second implant dosage being greater than the first kinetic energy and the first implant dosage, forming a source/drain feature on the implanted portion of the substrate opposite sides of the sacrificial gate structure, the source/drain feature being in contact with the plurality of first semiconductor layers of the fin structure, removing the sacrificial gate structure and the plurality of second semiconductor layers to expose portions of the plurality of first semiconductor layers of the fin structure, and forming a gate electrode layer to surround at least the exposed portion of one of the plurality of first semiconductor layers of the first fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   implanting first anti-punch through dopants into a substrate at a first kinetic energy and a first implant dosage;
   forming a stack of semiconductor layers over the substrate, the stack of the semiconductor layers comprising a plurality of first semiconductor layers and a plurality of second semiconductor layers alternatingly stacked;
   forming a fin structure from the stack of the semiconductor layers and the substrate;
   forming a sacrificial gate structure over a portion of the fin structure;
   removing portions of the fin structure not covered by the sacrificial gate structure to expose a portion of the substrate containing the first anti-punch through dopants;
   replacing an edge portion of the plurality of second semiconductor layers of the fin structure with a dielectric spacer;
   implanting second anti-punch through dopants into the portion of the substrate at a second kinetic energy and a second implant dosage, the second kinetic energy being different than the first kinetic energy;
   forming a source/drain feature on the implanted portion of the substrate on opposite sides of the sacrificial gate structure, the source/drain feature being in contact with the plurality of first semiconductor layers of the fin structure;
   removing the sacrificial gate structure and the plurality of second semiconductor layers to expose portions of the plurality of first semiconductor layers of the fin structure; and
   forming a gate electrode layer to surround at least the exposed portion of one of the plurality of first semiconductor layers of the fin structure.

2. The method of claim 1, further comprising:
   after removing portions of the fin structure not covered by the sacrificial gate structure, forming a recess in a top portion of the substrate so that a bottom of the recess is at a level lower than an interface defined between the dielectric spacer and the substrate.

3. The method of claim 2, wherein the second anti-punch through dopants are implanted so that a first dopant concentration underneath the source/drain feature is higher than a second dopant concentration underneath the gate electrode layer.

4. The method of claim 1, wherein the second kinetic energy is greater than the first kinetic energy.

5. The method of claim 4, wherein the second implant dosage is about 2 times to about 50 times greater than the first implant dosage.

6. The method of claim 5, wherein the first anti-punch through dopants comprise p-type dopants and the second anti-punch through dopants comprise carbon, carbon-containing dopant species, nitrogen, nitrogen-containing dopant species, or a combination thereof.

7. The method of claim 1, wherein the portions of the fin structure are removed such that a top surface of the exposed portion of the substrate is at an elevation lower than that of a top surface of the substrate underneath the sacrificial gate structure.

8. A method for forming a semiconductor device structure, comprising:
   forming a plurality of fin structures from a substrate, each of the plurality of fin structures comprising a plurality of first semiconductor layers and a plurality of second semiconductor layers alternatingly stacked;
   forming a sacrificial gate structure over a portion of the plurality of fin structures;

removing portions of the plurality of fin structures not covered by the sacrificial gate structure to expose a portion of the substrate;

providing dopants in the exposed portion of the substrate;

forming a source/drain feature over the exposed portion of the substrate;

removing the sacrificial gate structure and the plurality of second semiconductor layers to expose portions of the plurality of first semiconductor layers of each of the plurality of fin structures; and forming a gate electrode layer to surround at least the exposed portion of one of the plurality of first semiconductor layers of each of the plurality of fin structures.

9. The method of claim 8, wherein the dopants are provided in the exposed portion of the substrate through an ion implantation process.

10. The method of claim 8, wherein the dopants are provided in the exposed portion of the substrate through a solid state diffusion process.

11. The method of claim 8, wherein the dopants are provided by:

growing a silicon layer doped with a high doping concentration of the dopants on the exposed portion of the substrate;

subjecting the silicon layer to a thermal treatment so that the dopants are diffused into the exposed portion of the substrate; and removing at least a portion of the silicon layer.

12. The method of claim 11, wherein the source/drain feature is formed on the silicon layer.

13. The method of claim 11, wherein the source/drain feature is removed entirely.

14. The method of claim 8, wherein the dopants comprise carbon, carbon-containing dopant species, nitrogen, nitrogen-containing dopant species, or a combination thereof.

15. The method of claim 8, further comprising:

after forming the plurality of fin structures from the substrate, implanting anti-punch through dopants into the substrate.

16. The method of claim 15, wherein the anti-punch through dopants are chemically different than the dopants.

17. The method of claim 15, wherein the anti-punch through dopants are confined by the dopants.

18. A method for forming a semiconductor device structure, comprising:

forming a plurality of fin structures from a substrate, each of the plurality of fin structures comprising a plurality of first semiconductor layers and a plurality of second semiconductor layers alternatingly stacked;

forming a sacrificial gate structure over a portion of each of the plurality of fin structures;

removing portions of the plurality of fin structures not covered by the sacrificial gate structure to expose a portion of the substrate;

forming a non-doped silicon layer on the exposed portion of the substrate;

forming a source/drain feature on the non-doped silicon layer;

removing the sacrificial gate structure and the plurality of second semiconductor layers to expose portions of the plurality of first semiconductor layers of each of the plurality of fin structures; and forming a gate electrode layer to surround at least the exposed portion of one of the plurality of first semiconductor layers of each of the plurality of fin structures.

19. The method of claim 18, further comprising:

after forming the plurality of fin structures from the substrate, implanting anti-punch through dopants into the substrate.

20. The method of claim 19, wherein the non-doped silicon layer at a first device region of the substrate has a first height and the non-doped silicon layer at a second device region of the substrate has a second height that is different than the first height.

* * * * *